United States Patent
Lim et al.

(10) Patent No.: US 11,837,589 B2
(45) Date of Patent: Dec. 5, 2023

(54) TILED DISPLAY DEVICE

(71) Applicant: SAMSUNG DISPLAY CO., LTD., Yongin-si (KR)

(72) Inventors: Tae Woo Lim, Cheonan-si (KR); Hyung June Kim, Seongnam-si (KR); Eun Je Jang, Hwaseong-si (KR); Jang Bog Ju, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 105 days.

(21) Appl. No.: 17/412,079

(22) Filed: Aug. 25, 2021

(65) Prior Publication Data
US 2022/0139892 A1      May 5, 2022

(30) Foreign Application Priority Data
Nov. 5, 2020   (KR) .................. 10-2020-0146707

(51) Int. Cl.
*H01L 25/16* (2023.01)
*G09F 9/302* (2006.01)
*H01L 25/075* (2006.01)

(52) U.S. Cl.
CPC .......... *H01L 25/162* (2013.01); *G09F 9/3026* (2013.01); *H01L 25/0753* (2013.01); *H01L 25/167* (2013.01)

(58) Field of Classification Search
None
See application file for complete search history.

(56) References Cited

U.S. PATENT DOCUMENTS

| | | | |
|---|---|---|---|
| 9,762,844 B2 | 9/2017 | Kim et al. | |
| 10,036,911 B2 | 7/2018 | Cho et al. | |
| 2005/0178034 A1* | 8/2005 | Schubert | G09F 9/33 40/605 |
| 2014/0211129 A1* | 7/2014 | Bowser | G02F 1/1333 349/86 |
| 2017/0286044 A1* | 10/2017 | Kim | G09G 3/32 |

FOREIGN PATENT DOCUMENTS

| | | |
|---|---|---|
| KR | 10-2011-0101827 | 9/2011 |
| KR | 10-2016-0017372 | 2/2016 |
| KR | 10-2016-0064326 | 6/2016 |

* cited by examiner

*Primary Examiner* — Erik T. K. Peterson
*Assistant Examiner* — Christopher A. Schodde
(74) *Attorney, Agent, or Firm* — H.C. Park & Associates, PLC

(57) ABSTRACT

A tiled display device including a first display device; a second display device located at one side of the first display device in a first direction; a first chassis disposed under the first display device to support the first display device; and a second chassis disposed under the second display device to support the second display device. An end portion of the first chassis and an end portion of the second chassis are directly connected to each other, and an end portion of the first display device and an end portion of the second display device come into direct contact with each other.

19 Claims, 21 Drawing Sheets

EL: AE, ED, CE

TILED DISPLAY DEVICE

This application claims priority from and the benefit of Korean Patent Application No. 10-2020-0146707 filed on Nov. 5, 2020, which is hereby is incorporated by reference for all purposes as if fully set forth herein.

BACKGROUND

Field

Embodiments of the invention relate to a tiled display device.

Discussion of the Background

As the information society develops, demand for a display device for displaying an image is increasing in various forms. For example, the display device may be applied to various electronic devices such as a smart phone, a digital camera, a notebook computer, a navigation system, and a smart television. The display device may be a flat panel display device, such as a liquid crystal display device, a field emission display device, an organic light emitting display device, or the like. Among these flat panel displays, since a light-emitting display device includes a light emitting element in which each of pixels of a display panel can emit light by itself, an image can be displayed without a backlight unit providing light to the display panel.

When the display device is manufactured to have a large screen size, a defect rate of the light emitting element can increase due to an increase in the number of pixels, and productivity or reliability can deteriorate. To this end, a tiled display device can implement a large-sized screen by connecting a plurality of display devices each having a relatively small screen size. The tiled display device can include a boundary portion called a seam between the plurality of display devices due to a non-display region or bezel region of each of the plurality of display devices adjacent to each other. The boundary portion between the plurality of display devices gives a sense of disconnection to an entire screen when a single image is displayed on the entire screen, and thus deteriorates the immersion of the image.

The tiled display device includes a chassis respectively located under the display devices. The display device and the chassis corresponding to each other can be in a combined state. In the case of the tiled display device in which the display device and the chassis corresponding to each other are combined, a degree of visibility of the seam can vary according to a cutting tolerance of the display device, a cutting tolerance of the chassis, and an attachment tolerance between the display device and the chassis.

The above information disclosed in this Background section is only for understanding of the background of the inventive concepts, and, therefore, it may contain information that does not constitute prior art.

SUMMARY

An embodiment of the invention provides a tiled display device in which a boundary portion between a plurality of display devices is hardly recognized and stability against external impact may be secured.

Additional features of the inventive concepts will be set forth in the description which follows, and in part will be apparent from the description, or may be learned by practice of the inventive concepts.

An embodiment of the invention provides a tiled display device including a first display device; a second display device located at one side of the first display device in a first direction; a first chassis disposed under the first display device to support the first display device; and a second chassis disposed under the second display device to support the second display device. An end portion of the first chassis and an end portion of the second chassis are directly connected to each other, and an end portion of the first display device and an end portion of the second display device come into direct contact with each other.

Another embodiment of the invention provides a tiled display device including a first display device; a second display device located at one side of the first display device in a first direction; a first chassis disposed under the first display device to support the first display device; and a second chassis disposed under the second display device to support the second display device. An end portion of the first chassis and an end portion of the second chassis are directly connected, an end portion of the first display device and an end portion of the second display device come into direct contact with each other, connection portions between the first chassis and the second chassis include a first connection portion located at one side in a second direction crossing the first direction, a second connection portion located at the other side in the second direction, and a third connection portion located between the first connection portion and the second connection portion, and an overlapping area between the first display device and the second chassis in the first and third connection portions is larger than an overlapping area between the first display device and the second chassis in the second connection portion.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION OF THE EMBODIMENTS

Figure 1:
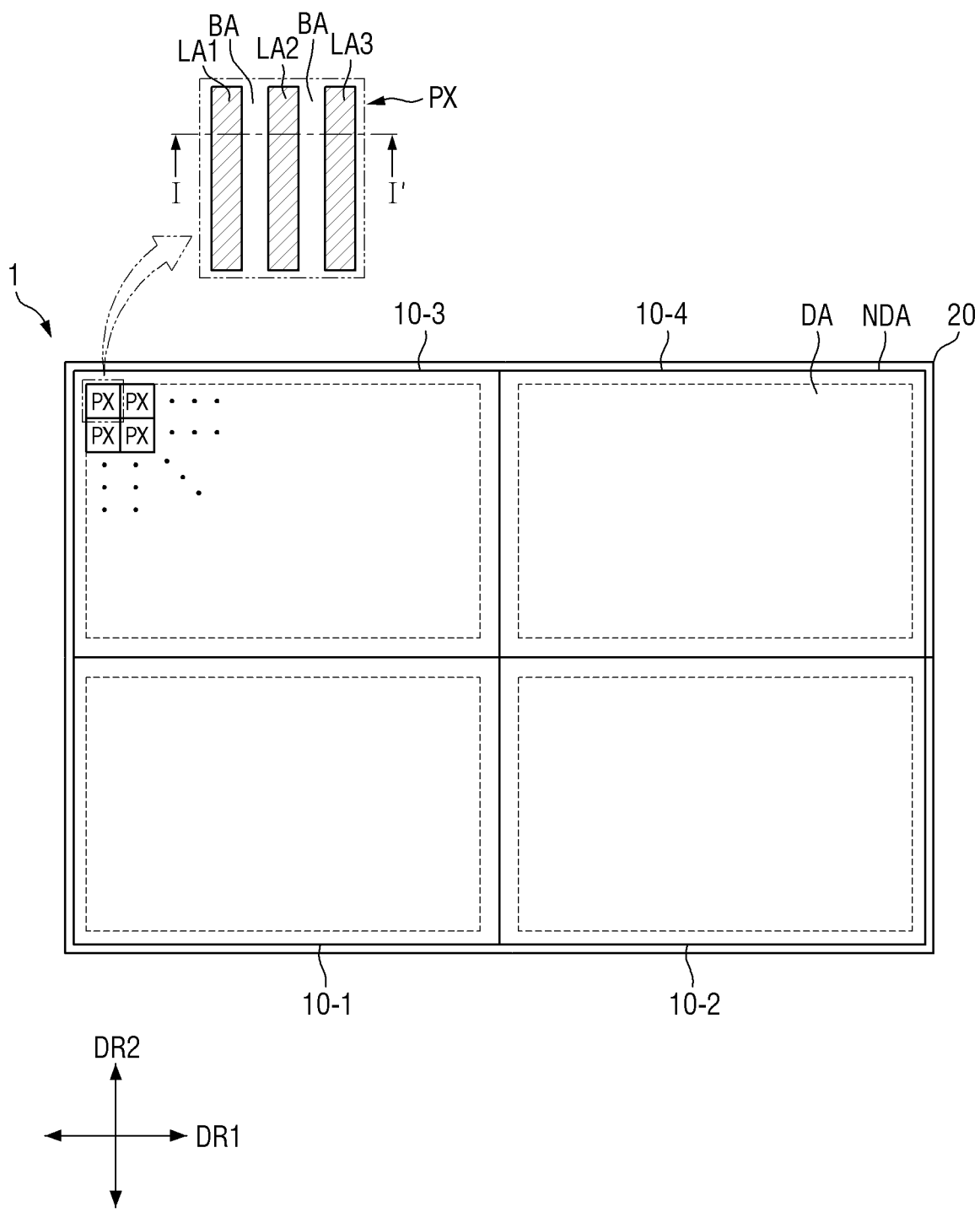
FIG. 1 is a plan view illustrating a tiled display device according to an embodiment.

In the following description, for the purposes of explanation, numerous specific details are set forth in order to provide a thorough understanding of various embodiments of the invention. As used herein "embodiments" are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the invention will be described with reference to the attached drawings.

FIG. 1 is a plan view illustrating a tiled display device according to an embodiment.

Referring to FIG. 1, a tiled display device 1 may have a rectangular planar shape. However, the inventive concepts are not limited thereto, and the planar shape of the tiled display device 1 may have a square shape, a circular shape, an oval shape, or other polygonal shapes. Hereinafter, a case in which a rectangle is applied as the planar shape of the tiled display device 1 will be described. The tiled display device 1 having a rectangular planar shape may include long sides extending along a first direction DR1 and short sides extending along a second direction DR2. As shown in FIG. 1, corners where the long sides and the short sides of the tiled display device 1 meet may be angular but are not limited thereto, and may be rounded.

The tiled display device 1 may be a large display device in which a plurality of display devices are arranged in a grid shape, and the display devices adjacent to each other are combined at an attachment portion. That is, the tiled display device 1 may include a plurality of display devices. The plurality of display devices may be connected in the first direction DR1 or the second direction DR2, and the tiled display device 1 may have a specific shape. For example, each of the plurality of display devices may have the same size, but the inventive concepts are not limited thereto. As another example, the plurality of display devices may have different sizes. For example, each of the plurality of display devices may have a rectangular shape including long sides and short sides. The plurality of display devices may be disposed with long sides or short sides connected to each other. Some of the display devices may be disposed at edges of the tiled display device 1 to form one side of the tiled display device 1. Some display devices may be disposed at the corners of the tiled display device 1 and may form two adjacent sides of the tiled display device 1. Some other display devices may be disposed in the tiled display device 1, and may be surrounded by the remaining display devices.

Hereinafter, for convenience of description, the tiled display device 1 is illustrated as including four display devices, and specifically, may include a first display device 10-1, a second display device 10-2 located at one side of the first display device 10-1 in the first direction DR1, a third display device 10-3 located at one side of the first display device 10-1 in the second direction DR2, and a fourth display device 10-4 located at one side of the third display device 10-3 in the first direction DR1.

Each of the display devices 10-1, 10-2, 10-3, and 10-4 may include a display region DA and a non-display region NDA. The display region DA may include a plurality of pixels PX to display an image. The plurality of pixels PX may be arranged in a matrix manner. The non-display region NDA may be disposed around the display region DA to surround the display region DA, and may not display an image. The non-display region NDA may completely surround the display region DA in a plan view.

The non-display regions NDA of the display devices 10-1, 10-2, 10-3, 10-4 may be connected to each other, and the display region DA of any one of the display devices 10-1, 10-2, 10-3, and 10-4 may be spaced apart from the display region DA of another one of the display devices 10-1, 10-2, 10-3, and 10-4 adjacent thereto with the non-display region NDA therebetween.

Referring to an enlarged view of FIG. 1, in the pixels PX of the display devices 10-1 to 10-4, each of the plurality of pixels may include light emitting regions LA1, LA2, and LA3 defined by a pixel defining film, and the light emitting regions LA1, LA2, and LA3 may emit light having a predetermined peak wavelength. For example, the display region DA of the display device may include first to third light emitting regions LA1, LA2, and LA3. Each of the first to third light emitting regions LA1, LA2, and LA3 may be regions from which light generated by a light emitting element of the display device is emitted to the outside of the display device.

The first to third light emitting regions LA1, LA2, and LA3 may emit the light having a predetermined peak wavelength to the outside of the display device. The first light emitting region LA1 may emit light of a first color, the second light emitting region LA2 may emit light of a second color, and the third light emitting region LA3 may emit light of a third color. For example, the light of a first color may be red light having a peak wavelength in the range of 610 nm to 650 nm, the light of a second color may be green light having a peak wavelength in the range of 510 nm to 550 nm, and the light of a third color may be blue light having a peak wavelength in the range of 440 nm to 480 nm, but the inventive concepts are not limited thereto.

The display region DA of each of the display devices 10-1 to 10-4 may include light blocking regions BA located between adjacent light emitting regions LA1, LA2, and LA3. For example, the light blocking regions BA between the light emitting regions may surround the first to third light emitting regions LA1 to LA3.

Figure 2:
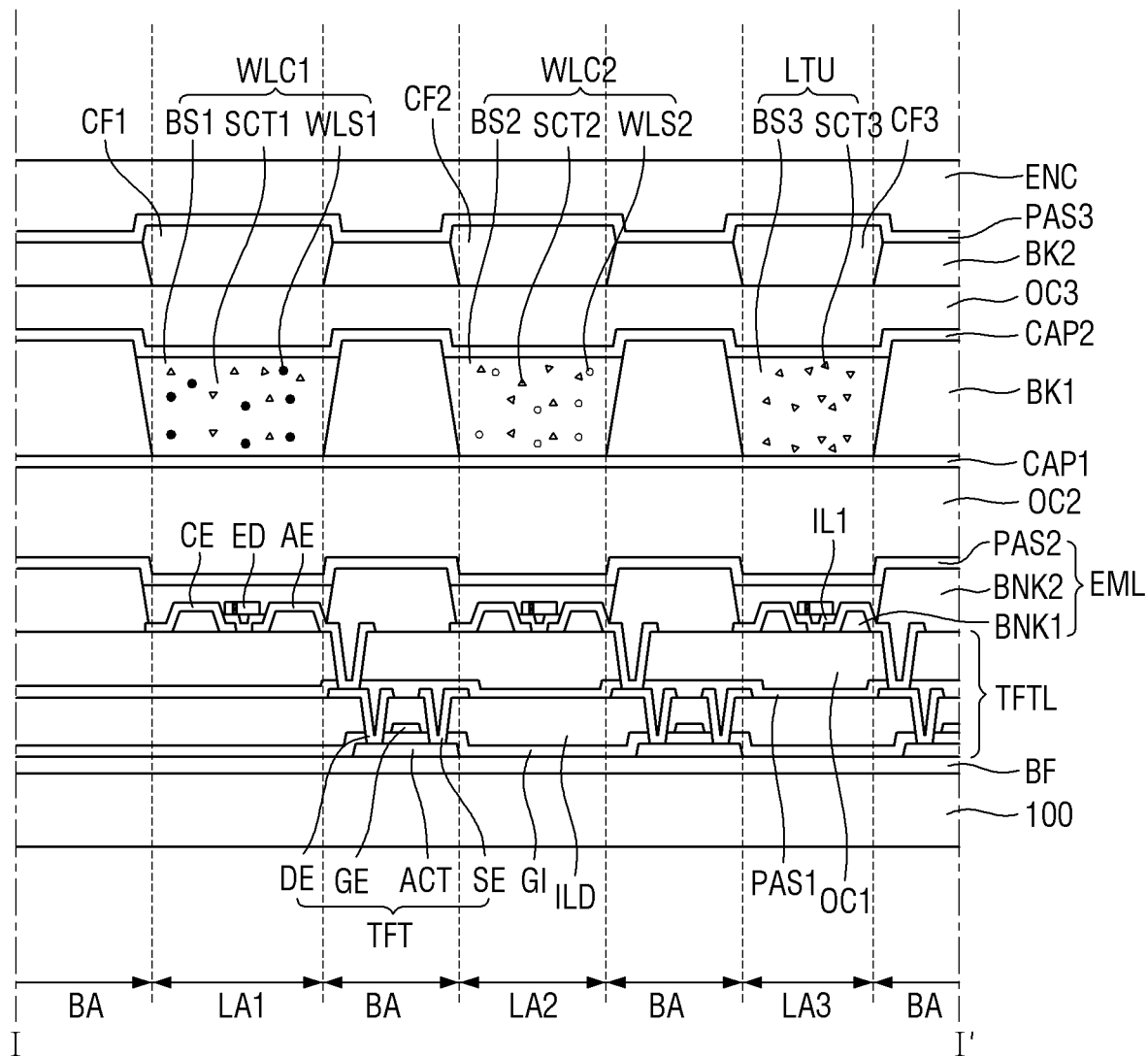
FIG. 2 is a cross-sectional view taken along line I-I' in an enlarged view in FIG. 1.

FIG. 2 is a cross-sectional view taken along line I-I' in an enlarged view in FIG. 1.

Referring to FIGS. 1 and 2, each of the display devices 10-1 to 10-4 may include a substrate 100, a buffer layer BF, a thin film transistor layer TFTL, and a light emitting element layer EML.

The substrate 100 may be a base substrate or a base member, and may be formed of an insulating material such as a polymer resin or the like. For example, the substrate 100 may be a rigid substrate.

The buffer layer BF may be disposed on the substrate 100. The buffer layer BF may be formed of an inorganic film capable of preventing the penetration of air or moisture.

The thin film transistor layer TFTL may include a thin film transistor TFT, a gate insulating film GI, an interlayer insulating film ILD, a first protective layer PAS1, and a first planarization layer OC1.

The thin film transistor TFT may be disposed on the buffer layer BF, and may configure a pixel circuit of each of the plurality of pixels.

A semiconductor layer ACT may be provided on the buffer layer BF. The semiconductor layer ACT may overlap a gate electrode GE, a source electrode SE, and a drain electrode DE. The semiconductor layer ACT may directly come into contact with the source electrode SE and the drain electrode DE, and may face the gate electrode GE with the gate insulating film GI interposed therebetween.

The gate electrode GE may be disposed on the gate insulating film GI. The gate electrode GE may overlap the semiconductor layer ACT with the gate insulating film GI interposed therebetween.

The source electrode SE and the drain electrode DE may be disposed to be spaced apart from each other on the interlayer insulating film ILD. The source electrode SE may come into contact with one end of the semiconductor layer ACT through a contact hole provided in the gate insulating film GI and the interlayer insulating film ILD. The drain electrode DE may come into contact with the other end of the semiconductor layer ACT through a contact hole provided in the gate insulating film GI and the interlayer insulating film ILD. The drain electrode DE may be connected to a first electrode AE of a light emitting member EL through a contact hole provided in the first protective layer PAS1 and the first planarization layer OC1.

The gate insulating film GI may be provided on the semiconductor layer ACT. For example, the gate insulating film GI may be disposed on the semiconductor layer ACT and the buffer layer BF, and may insulate the semiconductor layer ACT and the gate electrode GE. The gate insulating film GI may include a contact hole through which the source electrode SE passes and a contact hole through which the drain electrode DE passes.

The interlayer insulating film ILD may be disposed on the gate electrode GE. For example, the interlayer insulating film ILD may include the contact hole through which the source electrode SE passes and the contact hole through which the drain electrode DE passes.

The first protective layer PAS1 may be provided on the thin film transistor TFT to protect the thin film transistor TFT. For example, the first protective layer PAS1 may include a contact hole through which the first electrode AE passes.

The first planarization layer OC1 may be provided on the first protective layer PAS1 to planarize an upper end of the thin film transistor TFT. For example, the first planarization layer OC1 may include a contact hole through which the first electrode AE of the light emitting member EL passes.

The light emitting element layer EML may include the light emitting member EL, a first bank BNK1, a second bank BNK2, and a second protective layer PAS2.

The light emitting member EL may be provided on the thin film transistor TFT. The light emitting member EL may include the first electrode AE, a second electrode CE, and a light emitting element ED.

The first electrode AE may be provided on the first planarization layer OC1. For example, the first electrode AE may be disposed on the first bank BNK1 disposed on the first planarization layer OC1 to cover the first bank BNK1. The first electrode AE may be disposed to overlap one of the first to third light emitting regions LA1, LA2, and LA3 defined by the second bank BNK2. Further, the first electrode AE may be connected to the drain electrode DE of the thin film transistor TFT.

The second electrode CE may be provided on the first planarization layer OC1. For example, the second electrode CE may be disposed on the first bank BNK1 disposed on the first planarization layer OC1 to cover the first bank BNK1. The second electrode CE may be disposed to overlap one of the first to third light emitting regions LA1, LA2, and LA3 defined by the second bank BNK2. For example, the second electrode CE may receive a common voltage supplied to all pixels.

A first insulating layer IL1 may cover a part of the first electrode AE and a part of the second electrode CE adjacent to each other, and may insulate the first electrode AE and the second electrode CE.

The light emitting element ED may be disposed between the first electrode AE and the second electrode CE on the first planarization layer OC1. The light emitting element ED may be disposed on the first insulating layer IL1. One end of the light emitting element ED may be connected to the first electrode AE, and the other end of the light emitting element ED may be connected to the second electrode CE. For example, the plurality of light emitting elements ED may include an active layer having the same material to emit light of the same wavelength band or light of the same color. The light emitted from the first to third light emitting regions LA1, LA2, and LA3 may have the same color. For example, the plurality of light emitting elements ED may emit light of a third color or blue light having a peak wavelength in the range of 440 nm to 480 nm.

The second bank BNK2 may be disposed on the first planarization layer OC1 to define the first to third light emitting regions LA1, LA2, and LA3. For example, the second bank BNK2 may surround each of the first to third light emitting regions LA1, LA2, and LA3, but is not limited thereto. The second bank BNK2 may be disposed in the light blocking region BA.

The second protective layer PAS2 may be disposed on the plurality of light emitting members EL and the second bank BNK2. The second protective layer PAS2 may cover and protect the plurality of light emitting members EL.

The display device may further include a second planarization layer OC2, a first capping layer CAP1, a first light blocking member BK1, a first wavelength conversion part WLC1, a second wavelength conversion part WLC2, and a light transmission part LTU, a second capping layer CAP2, a third planarization layer OC3, a second light blocking member BK2, first to third color filters CF1, CF2, and CF3, a third protective layer PAS3, and an encapsulation layer ENC.

The second planarization layer OC2 may be provided on the light emitting element layer EML and may planarize an upper end of the light emitting element layer EML. The second planarization layer OC2 may include an organic material.

The first capping layer CAP1 may be disposed on the second planarization layer OC2. The first capping layer CAP1 may seal lower surfaces of the first and second wavelength conversion parts WLC1 and WLC2 and the light transmission part LTU. The first capping layer CAP1 may include an inorganic material.

The first light blocking member BK1 may be disposed in the light blocking region BA on the first capping layer CAP1. The first light blocking member BK1 may overlap the second bank BNK2 in a thickness direction. The first light blocking member BK1 may block the transmission of light.

The first light blocking member BK1 may include an organic light blocking material and a liquid repellent component.

Since the first light blocking member BK1 may include the liquid repellent component, the first and second wavelength conversion parts WLC1 and WLC2 and the light transmission part LTU may be separated into corresponding light emitting regions LA.

The first wavelength conversion part WLC1 may be disposed in the first light emitting region LA1 on the first capping layer CAP1. The first wavelength conversion part WLC1 may be surrounded by the first light blocking member BK1. The first wavelength conversion part WLC1 may include a first base resin BS1, a first scatter SCT1, and a first wavelength shifter WLS1.

The first base resin BS1 may include a material having relatively high light transmittance. The first base resin BS1 may be formed of a transparent organic material. For example, the first base resin BS1 may include at least one of organic materials, such as an epoxy resin, an acrylic resin, a cardo resin, an imide resin, and the like.

The first scatter SCT1 may have a refractive index different from that of the first base resin BS1, and may form an optical interface with the first base resin BS1.

The first wavelength shifter WLS1 may convert or shift a peak wavelength of incident light to a first peak wavelength. For example, the first wavelength shifter WLS1 may convert blue light provided from the display device into red light having a single peak wavelength in the range of 610 nm to 650 nm and emit the red light. The first wavelength shifter WLS1 may be a quantum dot, a quantum rod, or a phosphor. The quantum dot may be particulate matter which emits a specific color while electrons transition from a conduction band to a valence band.

The light emitted by the first wavelength shifter WLS1 may have a full width at half maximum (FWHM) of an emission wavelength spectrum of 45 nm or less, 40 nm or less, or 30 nm or less, and the color purity and color reproducibility of the color displayed by the display device may be further improved.

Some of the blue light provided from the light emitting element layer EML may pass through the first wavelength conversion part WLC1 without being converted into the red light by the first wavelength shifter WLS1. The light incident on the first color filter CF1 without being converted by the first wavelength conversion part WLC1 among blue light provided by the light emitting element layer EML may be blocked by the first color filter CF1. Further, the red light converted by the first wavelength conversion part WLC1 among blue light provided from the display device may pass through the first color filter CF1 and may be emitted to the outside. Accordingly, the first light emitting region LA1 may emit red light.

The second wavelength conversion part WLC2 may be disposed in the second light emitting region LA2 on the first capping layer CAP1. The second wavelength conversion part WLC2 may be surrounded by the first light blocking member BK1. The second wavelength conversion part WLC2 may include a second base resin BS2, a second scatter SCT2, and a second wavelength shifter WLS2.

The second base resin BS2 may include a material having relatively high light transmittance. The second base resin BS2 may be made of a transparent organic material.

The second scatter SCT2 may have a refractive index different from that of the second base resin BS2, and may form an optical interface with the second base resin BS2. For example, the second scatter SCT2 may include light scattering materials or light scattering particles which scatter at least a portion of the transmitted light.

The second wavelength shifter WLS2 may convert or shift the peak wavelength of the incident light into a second peak wavelength different from the first peak wavelength of the first wavelength shifter WLS1. For example, the second wavelength shifter WLS2 may convert the blue light provided from the display device into green light having a single peak wavelength in the range of 510 nm to 550 nm and emit the green light. The second wavelength shifter WLS2 may be a quantum dot, a quantum rod, or a phosphor. The second wavelength shifter WLS2 may include a material having the same effect as the material exemplified in the first wavelength shifter WLS1.

The light transmission part LTU may be disposed in the third light emitting region LA3 on the first capping layer CAP1. The light transmission part LTU may be surrounded by the first light blocking member BK1. The light transmission part LTU may transmit the incident light by maintaining a peak wavelength of the incident light. The light transmission part LTU may include a third base resin BS3 and a third scatter SCT3.

The third base resin BS3 may include a material having relatively high light transmittance. The third base resin BS3 may be made of a transparent organic material.

The third scatter SCT3 may have a refractive index different from that of the third base resin BS3, and may form an optical interface with the third base resin BS3. For example, the third scatter SCT3 may include light scattering materials or light scattering particles which scatter at least a portion of the transmitted light.

The first and second wavelength conversion parts WLC1 and WLC2 and the light transmission part LTU are disposed on the light emitting element layer EML through the second planarization layer OC2 and the first capping layer CAP1, and thus, the display device may not require a separate substrate for the first and second wavelength conversion parts WLC1 and WLC2 and the light transmission part LTU.

The second capping layer CAP2 may cover the first and second wavelength conversion parts WLC1 and WLC2, the light transmission part LTU, and the first light blocking member BK1.

The third planarization layer OC3 may be provided on the second capping layer CAP2 and may planarize the upper ends of the first and second wavelength conversion parts WLC1 and WLC2 and the light transmission part LTU. The third planarization layer OC3 may include an organic material.

The second light blocking member BK2 may be disposed in the light blocking region BA on the third planarization layer OC3. The second light blocking member BK2 may overlap the first light blocking member BK1 or the second bank BNK2 in the thickness direction. The second light blocking member BK2 may block the transmission of light.

The first color filter CF1 may be disposed in the first light emitting region LA1 on the third planarization layer OC3. The first color filter CF1 may be surrounded by the second light blocking member BK2. The first color filter CF1 may overlap the first wavelength conversion part WLC1 in the thickness direction. The first color filter CF1 may selectively transmit the light of a first color (for example, the red light), and may block or absorb the light of a second color (for example, the green light) and the light of a third color (for example, the blue light).

The second color filter CF2 may be disposed in the second light emitting region LA2 on the third planarization layer OC3. The second color filter CF2 may be surrounded by the second light blocking member BK2. The second color filter CF2 may overlap the second wavelength conversion part WLC2 in the thickness direction. The second color filter CF2 may selectively transmit the light of a second color (for example, the green light), and may block or absorb the light of a first color (for example, the red light) and the light of a third color (for example, the blue light).

The third color filter CF3 may be disposed in the third light emitting region LA3 on the third planarization layer OC3. The third color filter CF3 may be surrounded by the second light blocking member BK2. The third color filter CF3 may overlap the light transmission part LTU in the thickness direction. The third color filter CF3 may selectively transmit the light of a third color (for example, the blue light), and may block or absorb the light of a first color (for example, the red light) and the light of a second color (for example, the green light).

The first to third color filters CF1, CF2, and CF3 may absorb some of the light introduced from the outside of the display device to reduce the reflected light caused by external light. Accordingly, the first to third color filters CF1, CF2, and CF3 may prevent color distortion due to reflection of the external light.

The third protective layer PAS3 may cover the first to third color filters CF1, CF2, and CF3. The third protective layer PAS3 may protect the first to third color filters CF1, CF2, and CF3.

The encapsulation layer ENC may be disposed on the third protective layer PAS3. For example, the encapsulation layer ENC may include at least one inorganic layer to prevent the penetration of oxygen or moisture. Also, the encapsulation layer ENC may include at least one organic layer to protect the display device from foreign matter such as dust.

Figure 3:
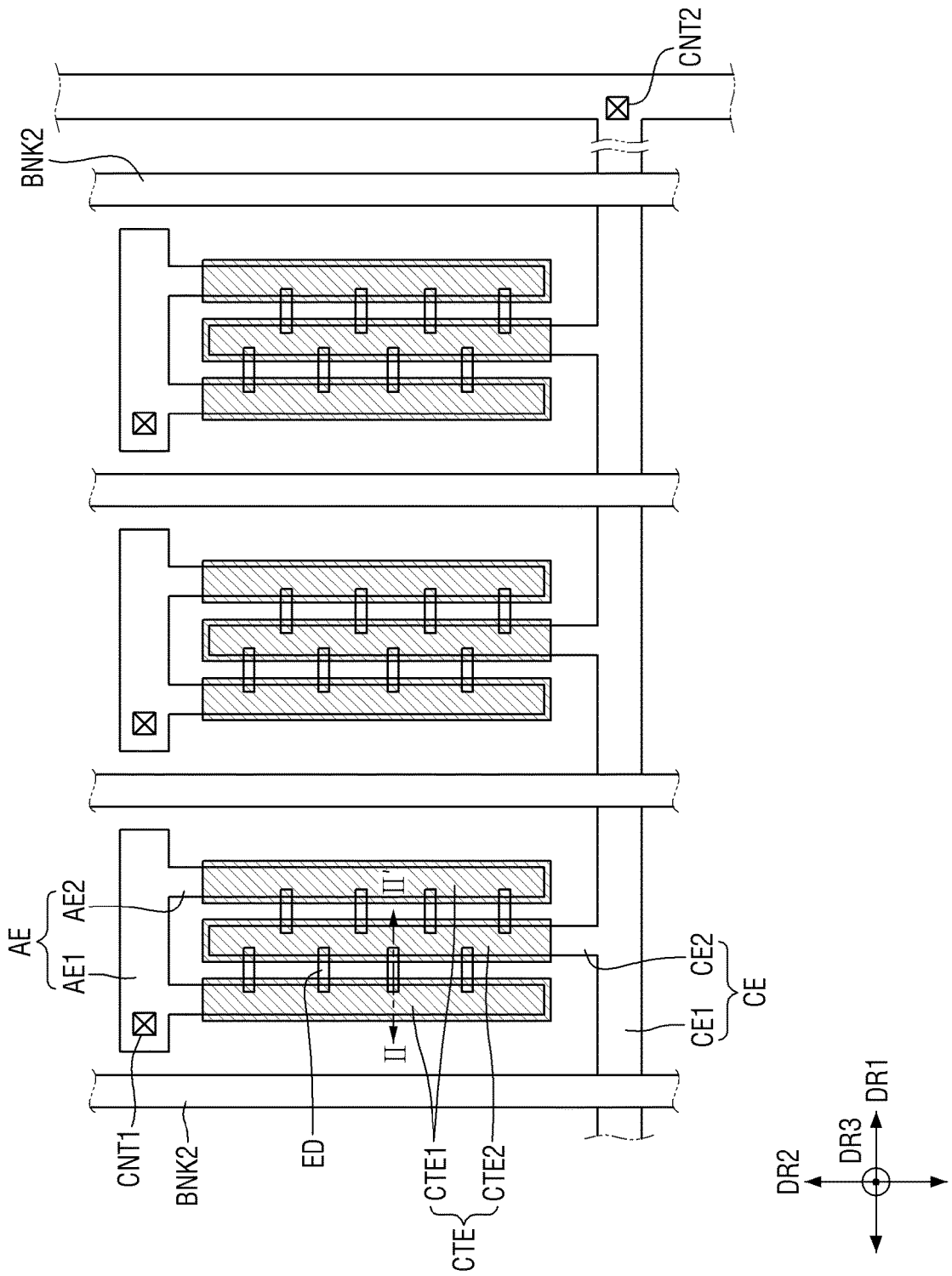
FIG. 3 is a plan view illustrating a pixel of one among display devices according to an embodiment.
Figure 4:
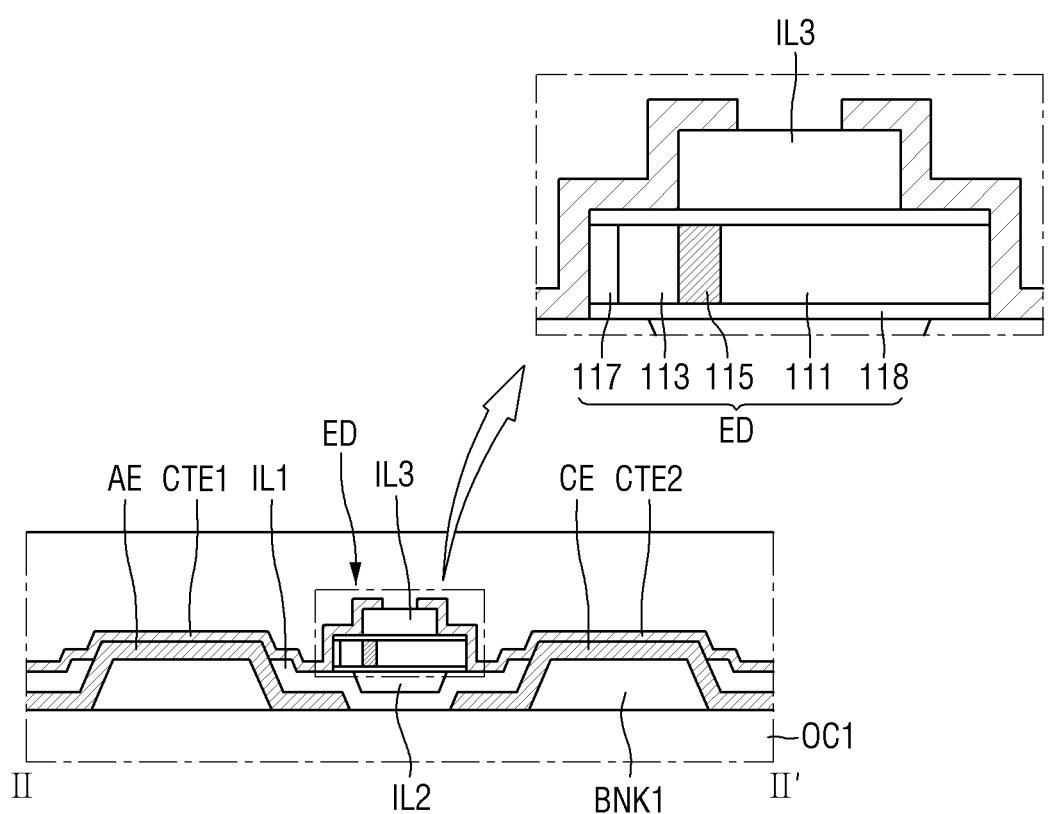
FIG. 4 is a cross-sectional view taken along line II-II' in FIG. 3.

FIG. 3 is a plan view illustrating a pixel of one among display devices according to an embodiment. FIG. 4 is a cross-sectional view taken along line II-IF in FIG. 3.

Referring to FIGS. 3 and. 4 along with FIG. 2, each of the plurality of pixels may include first to third sub-pixels. The first to third sub-pixels may respectively correspond to the first to third light emitting regions LA1, LA2, and LA3. The light emitting elements ED of the first to third sub-pixels may emit light through the first to third light emitting regions LA1, LA2, and LA3.

Each of the first to third sub-pixels may emit light of the same color. For example, the first to third sub-pixels may include the same type of light emitting element ED, and may emit the light of a third color or the blue light. As another example, the first sub-pixel may emit the light of a first color or the red light, the second sub-pixel may emit the light of a second color or the green light, and the third sub-pixel may emit the light of a third color or the blue light.

Each of the first to third sub-pixels may include the first and second electrodes AE and CE, the light emitting element ED, a plurality of contact electrodes CTE, and a plurality of second banks BNK2.

The first and second electrodes AE and CE may be electrically connected to the light emitting element ED to receive a predetermined voltage, and the light emitting element ED may emit light of a specific wavelength band. At least some of the first and second electrodes AE and CE may form an electric field in the pixel, and the light emitting element ED may be aligned by the electric field.

For example, the first electrode AE may be a pixel electrode separated for each of the first to third sub-pixels, and the second electrode CE may be a common electrode commonly connected to each of the first to third sub-pixels. One of the first electrode AE and the second electrode CE may be an anode of the light emitting element ED, and the other may be a cathode of the light emitting element ED.

The first electrode AE may include a first electrode stem part AE1 extending in the first direction DR1, and at least one first electrode branch part AE2 branched from the first electrode stem part AE1 and extending in the second direction DR2.

The first electrode stem part AE1 of each of the first to third sub-pixels may be spaced apart from the first electrode stem part AE1 of an adjacent sub-pixel, and the first electrode stem part AE1 may be disposed on a virtual extension line with the first electrode stem part AE1 of the adjacent sub-pixel in the first direction DR1. The first electrode stem parts AE1 of the first to third sub-pixels may receive different signals and may be independently driven.

The first electrode branch part AE2 may be branched from the first electrode stem part AE1 and may extend in the second direction DR2. One end of the first electrode branch part AE2 may be connected to the first electrode stem part AE1, and the other end of the first electrode branch part AE2 may be spaced apart from a second electrode stem part CE1 facing the first electrode stem part AE1.

The second electrode CE may include the second electrode stem part CE1 extending in the first direction DR1, and a second electrode branch part CE2 branched from the second electrode stem part CE1 and extending in the second direction DR2. The second electrode stem part CE1 of each of the first to third sub-pixels may be connected to the second electrode stem part CE1 of an adjacent sub-pixel. The second electrode stem part CE1 may extend in the first direction DR1 to cross the plurality of pixels. The second electrode stem part CE1 may be connected to an outer portion of the display region DA or a portion extending in one direction from the non-display region NDA.

The second electrode branch part CE2 may be spaced apart from and face the first electrode branch part AE2. One end of the second electrode branch part CE2 may be connected to the second electrode stem part CE1, and the other end of the second electrode branch part CE2 may be spaced apart from the first electrode stem part AE1.

The first electrode AE may be electrically connected to the thin film transistor layer TFTL of the display device through a first contact hole CNT1, and the second electrode CE to may be electrically connected to the thin film transistor layer TFTL of the display device through a second contact hole CNT2. For example, the first contact hole CNT1 may be disposed in each of the plurality of first electrode stem parts AE1, and the second contact hole CNT2 may be disposed in the second electrode stem part CE1, but the inventive concepts are not limited thereto.

The second banks BNK2 may be disposed at boundaries between the plurality of pixels. The plurality of first electrode stem parts AE1 may be spaced apart from each other based on the second banks BNK2. The second banks BNK2 may extend in the second direction DR2 and may be disposed at the boundaries of pixels SP arranged in the first direction DR1. In addition, the second banks BNK2 may also be disposed at the boundaries of the pixels SP arranged in the second direction DR2. The second banks BNK2 may define the boundaries between the plurality of pixels.

When the display device is manufactured, the second banks BNK2 may prevent ink from crossing the boundaries of the pixels SP when the light emitting element ED dispersed in an ink is sprayed. The second banks BNK2 may separate inks of different dispersed light emitting elements ED so that the inks are not mixed with each other.

The light emitting element ED may be disposed between the first electrode AE and the second electrode CE. One end of the light emitting element ED may be connected to the first electrode AE, and the other end of the light emitting element ED may be connected to the second electrode CE.

The plurality of light emitting elements ED may be disposed to be spaced apart from each other, and may be substantially aligned in parallel with each other. A separation interval between the light emitting elements ED is not specifically limited.

The plurality of light emitting elements ED may include an active layer having the same material and may emit light of the same wavelength band or light of the same color. The first to third sub-pixels may emit light of the same color. For example, the plurality of light emitting elements ED may emit the light of a third color or the blue light having a peak wavelength in the range of 440 nm to 480 nm.

Contact electrodes CTE may include first and second contact electrodes CTE1 and CTE2. The first contact electrode CTE1 may cover a part of the first electrode branch part AE2 and the light emitting element ED, and may electrically connect the first electrode branch part AE2 and the light emitting element ED. The second contact electrode CTE2 may cover the second electrode branch part CE2 and the other part of the light emitting element ED, and may electrically connect the second electrode branch part CE2 and the light emitting element ED.

The first contact electrode CTE1 may be disposed on the first electrode branch part AE2 and may extend in the second direction DR2. The first contact electrode CTE1 may come into contact with one end of the light emitting element ED. The light emitting element ED may be electrically connected to the first electrode AE through the first contact electrode CTE1.

The second contact electrode CTE2 may be disposed on the second electrode branch part CE2 and may extend in the second direction DR2. The second contact electrode CTE2 may be spaced apart from the first contact electrode CTE1 in the first direction DR1. The second contact electrode CTE2 may come into contact with the other end of the light emitting element ED. The light emitting element ED may be electrically connected to the second electrode CE through the second contact electrode CTE2.

The light emitting element layer EML of the display device may be disposed on the thin film transistor layer TFTL and may include first to third insulating layers ILL IL2, and IL3.

The plurality of first banks BNK1 may be respectively disposed in the first to third light emitting regions LA1, LA2, and LA3. Each of the plurality of first banks BNK1 may correspond to the first electrode AE or the second electrode CE. Each of the first and second electrodes AE and CE may be disposed on the corresponding first bank BNK1. For example, the plurality of first banks BNK1 may be disposed on the first planarization layer OC1, and a side surface of each of the plurality of first banks BNK1 may be inclined from the first planarization layer OC1. The inclined surfaces of the first bank BNK1 may reflect light emitted from the light emitting element ED.

The first electrode stem part AE1 may include the first contact hole CNT1 passing through the first planarization layer OC1. The first electrode stem part AE1 may be electrically connected to the thin film transistor TFT through the first contact hole CNT1.

The second electrode stem part CE1 may extend in the first direction DR1 and may also be disposed in a non-light emitting region where the light emitting element ED is not disposed. The second electrode stem part CE1 may include the second contact hole CNT2 passing through the first planarization layer OC1. The second electrode stem part CE1 may be electrically connected to a power electrode through the second contact hole CNT2. The second electrode CE may receive a predetermined electrical signal from the power electrode.

The first and second electrodes AE and CE may include a transparent conductive material. The first and second electrodes AE and CE may include a conductive material having high reflectivity. The first and second electrodes AE and CE may have a structure in which one or more layers of a transparent conductive material and a metal having high reflectivity are stacked, or may be formed as one layer including the above.

The first insulating layer IL1 may be disposed on the first planarization layer OC1, the first electrode AE, and the second electrode CE. The first insulating layer IL1 may cover a part of each of the first and second electrodes AE and CE.

The first insulating layer IL1 may protect the first and second electrodes AE and CE, and may insulate the first and second electrodes AE and CE from each other. The first insulating layer IL1 may prevent the light emitting element ED from being damaged due to direct contact with other members.

The light emitting element ED may be disposed between the first electrode AE and the second electrode CE on the first and second insulating layers IL1 and IL2. One end of the light emitting element ED may be connected to the first electrode AE, and the other end of the light emitting element ED may be connected to the second electrode CE.

The third insulating layer IL3 may be partially disposed on the light emitting element ED disposed between the first and second electrodes AE and CE. The third insulating layer IL3 may partially surround an outer surface of the light emitting element ED. The third insulating layer IL3 may protect the light emitting element ED. The third insulating layer IL3 may surround the outer surface of the light emitting element ED.

The contact electrodes CTE may include the first and second contact electrodes CTE1 and CTE2. The first contact electrode CTE1 may cover the first electrode branch part AE2 and a part of the light emitting element ED, and may electrically connect the first electrode branch part AE2 and the light emitting element ED. The second contact electrode CTE2 may cover the second electrode branch part CE2 and the other part of the light emitting element ED, and may electrically connect the second electrode branch part CE2 and the light emitting element ED.

The first contact electrode CTE1 may be disposed on the first electrode branch part AE2 and may extend in the second direction DR2. The first contact electrode CTE1 may come into contact with one end of the light emitting element ED. The light emitting element ED may be electrically connected to the first electrode AE through the first contact electrode CTE1.

The second contact electrode CTE2 may be disposed on the second electrode branch part CE2 and may extend in the second direction DR2. The second contact electrode CTE2 may be spaced apart from the first contact electrode CTE1 in the first direction DR1. The second contact electrode CTE2 may come into contact with the other end of the light emitting element ED. The light emitting element ED may be electrically connected to the second electrode CE through the second contact electrode CTE2.

The contact electrodes CTE may include a conductive material.

Figure 5:
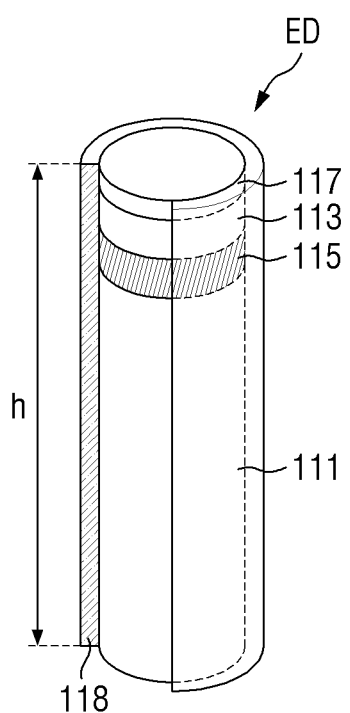
FIG. 5 is a view illustrating a light emitting element according to an embodiment.

FIG. 5 is a view illustrating a light emitting element according to an embodiment.

Referring to FIG. 5, the light emitting element ED may be a light emitting diode. For example, the light emitting element ED may have a size of a micro-meter or a nano-meter, and may be an inorganic light emitting diode including an inorganic material. The inorganic light emitting diode may be aligned between two electrodes according to an electric field formed in a specific direction between the two electrodes facing each other.

The light emitting element ED may have a shape elongated in one direction. The light emitting element ED may have a shape such as a rod, a wire, a tube, or the like. The light emitting element ED may include a first semiconductor layer 111, a second semiconductor layer 113, an active layer 115, an electrode layer 117, and an insulating film 118.

The first semiconductor layer 111 may be an n-type semiconductor. The second semiconductor layer 113 may be disposed on the active layer 115. Each of the first and second semiconductor layers 111 and 113 may be formed of one layer, but the inventive concepts are not limited thereto.

The active layer 115 may be disposed between the first and second semiconductor layers 111 and 113. The active layer 115 may include a material having a single or multiple quantum well structure. When the active layer 115 includes a material having a multiple quantum well structure, a plurality of quantum layers and well layers may be alternately stacked.

Light may be emitted from the active layer 115 in a longitudinal direction of the light emitting element ED, and may also be emitted to both side surfaces. The directivity of light emitted from the active layer 115 may not be limited.

The electrode layer 117 may be an ohmic contact electrode. As another example, the electrode layer 117 may be a Schottky contact electrode. The light emitting element ED may include at least one electrode layer 117.

The insulating film 118 may surround outer surfaces of the plurality of semiconductor layers and the electrode layers. The insulating film 118 may surround an outer surface of the active layer 115 and may extend in a direction in which the light emitting element ED extends. The insulating film 118 may protect the light emitting element ED.

The insulating film 118 may include materials having an insulating characteristic, for example, silicon oxide ($SiO_x$), silicon nitride ($SiN_x$), silicon oxynitride ($SiO_xN_y$), aluminum nitride (AlN), aluminum oxide ($Al_2O_3$), and the like.

An outer surface of the insulating film 118 may be surface-treated. When manufacturing the display device, the light emitting element ED may be sprayed onto the electrode to be aligned in a state of being dispersed in a predetermined ink.

Figure 6:
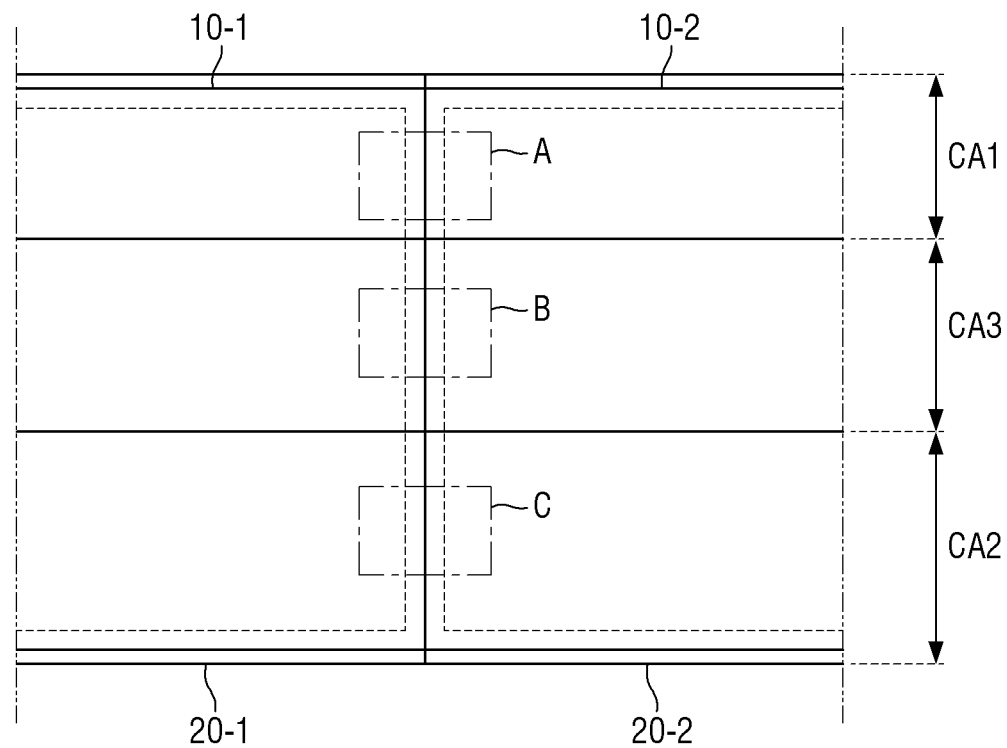
FIG. 6 is a plan view in which a periphery including a boundary portion between a first display device and a second display device is enlarged.

FIG. 6 is a plan view in which a periphery including a boundary portion between the first display device and the second display device is enlarged. Hereinafter, the boundary portion between the first display device 10-1 and the second display device 10-2 in the tiled display device (see 1 in FIG. 1) will be mainly described, and when no special distinction is necessary, descriptions of boundary portions between other display devices other than the boundary portion between the first display device 10-1 and the second display device 10-2 will be omitted.

Referring to FIGS. 1 and 6, the tiled display device 1 may further include a first chassis 20-1 overlapping the first display device 10-1, and a second chassis 20-2 overlapping the second display device 10-2.

The first chassis 20-1 and the first display device 10-1 may correspond to, be coupled to, or be assembled with each other, and the second chassis 20-2 and the second display device 10-2 may correspond to, be coupled to, or be assembled with each other.

The chassis 20-1 and 20-2 may support the corresponding display devices 10-1 and 10-2 from below. In an embodiment, the chassis 20-1 and 20-2 may be coupled (or fastened) to each other. Since the chassis 20-1 and 20-2 are coupled (or fastened) to each other, the display devices 10-1 and 10-2 are not directly connected to each other, but are assembled with the corresponding chassis 20-1 and 20-2, it is possible to stably assemble the tiled display device 1.

The chassis 20-1 and 20-2 may not only support the corresponding display devices 10-1 and 10-2 from below, but also prevent damage to the corresponding display devices 10-1 and 10-2. For example, the chassis 20-1 and 20-2 may prevent damage to the corresponding display devices 10-1 and 10-2 due to thermal deformation, an external impact, or the like in a daily environment. Specifically, in relation to prevention of the external impact to the display devices 10-1 and 10-2 of the chassis 20-1 and 20-2, since the chassis 20-1 and 20-2 protrude further outward than end portions of the display devices 10-1 and 10-2, it may be advantageous for preventing the external impact to the display device 10-1 or 10-2 of the chassis 20-1 or 20-2.

However, when the chassis 20-1 and 20-2 protrude excessively outward from end portions of the display devices 10-1 and 10-2, eventually, in the tiled display device in which overall assembly is performed through combination between the chassis 20-1 and 20-2, an area of a boundary portion of the display devices 10-1 and 10-2 (alternatively, a width or a distance between end portions) should increase.

In the tiled display device 1 according to an embodiment, end portions of each of the chassis 20-1 and 20-2 coupled to each other to reduce visibility of the boundary portion between the adjacent display devices 10-1 and 10-2 include a convex portion and a concave portion, and a method of coupling or assembling the first chassis 20-1 and the second chassis 20-2 in a method in which the convex portion of the first chassis 20-1 and the concave portion of the second chassis 20-2 correspond to each other, and the concave portion of the first chassis 20-1 and the convex portion of the second chassis 20-2 correspond to each other is adopted.

Accordingly, since the area (or the width) of the boundary portion between the display devices 10-1 and 10-2 is reduced by a width of the recessed portion of each chassis 20-1 and 20-2, the visibility of the boundary portion between the display devices 10-1 and 10-2 may decrease.

Further, since the convex portions of the chassis 20-1 and 20-2 are formed to protrude outward from end portions of the corresponding display devices 10-1 and 10-2, there is an advantage in that prevention of external impacts to the display device 10-1 and 10-2 may be simultaneously achieved.

That is, in the tiled display device according to an embodiment, the end portion of the first chassis 20-1 and the end portion of the second chassis 20-2 may be directly connected, and the end portion of the first display device 10-1 and the end portion of the second display device 10-2 may come into direct contact with each other.

The boundary portion between the display devices 10-1 and 10-2 may include a first coupling portion CA1 located at one side in the second direction DR2, a second coupling portion CA2 located at the other side in the second direction DR2, and a third coupling portion CA3 positioned between the first coupling portion CA1 and the second coupling portion CA2.

Hereinafter, a detailed description of the structure of the tiled display device 1 described above will be continued.

Figure 7:
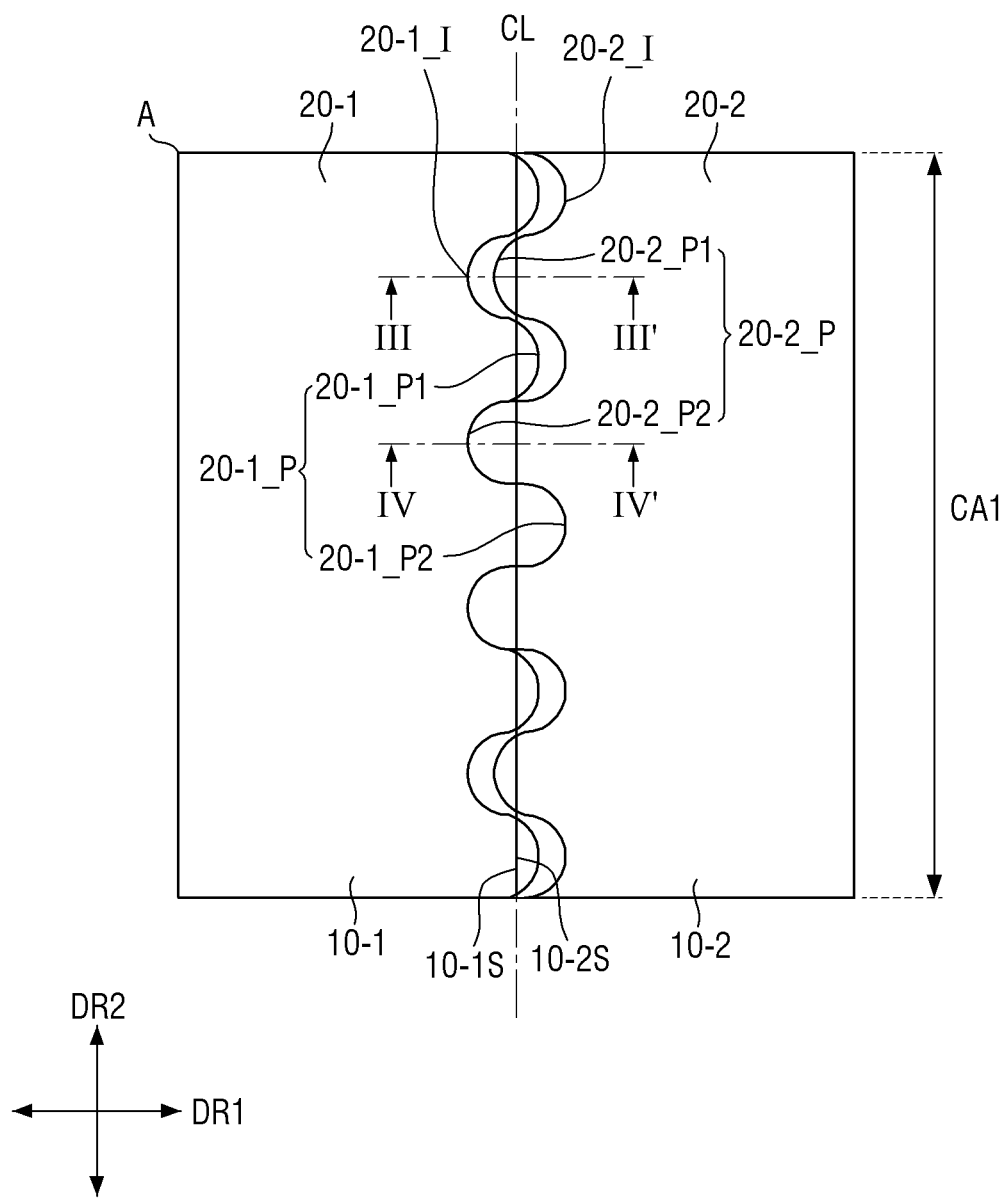
FIG. 7 is an enlarged plan view of region A in FIG. 6.
Figure 8:
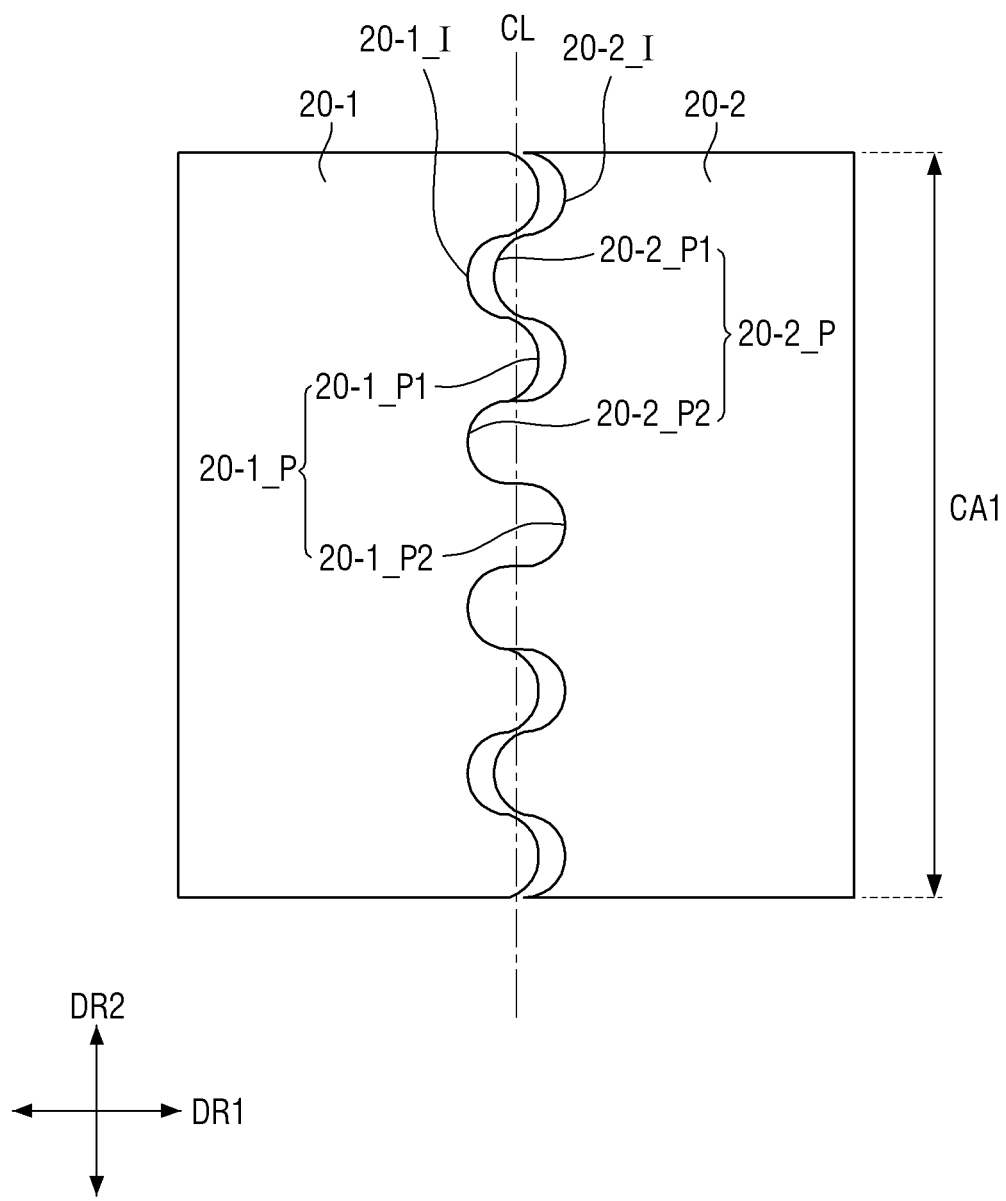
FIG. 8 is a plan view illustrating a first chassis and a second chassis in FIG. 7.
Figure 9:
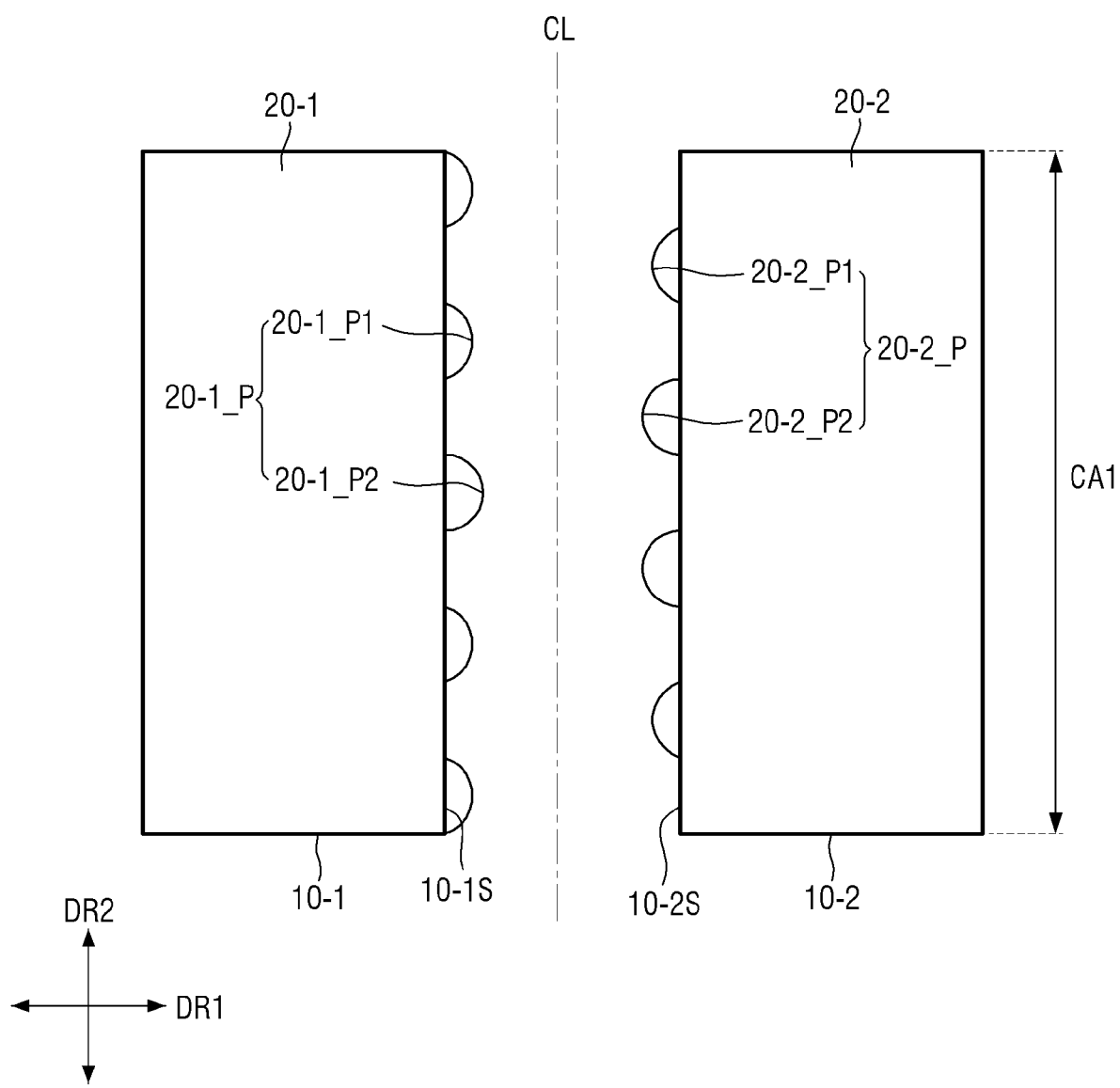
FIG. 9 is a plan view illustrating a state in which the first display device and the second display device in FIG. 7 are spaced apart.
Figure 10:
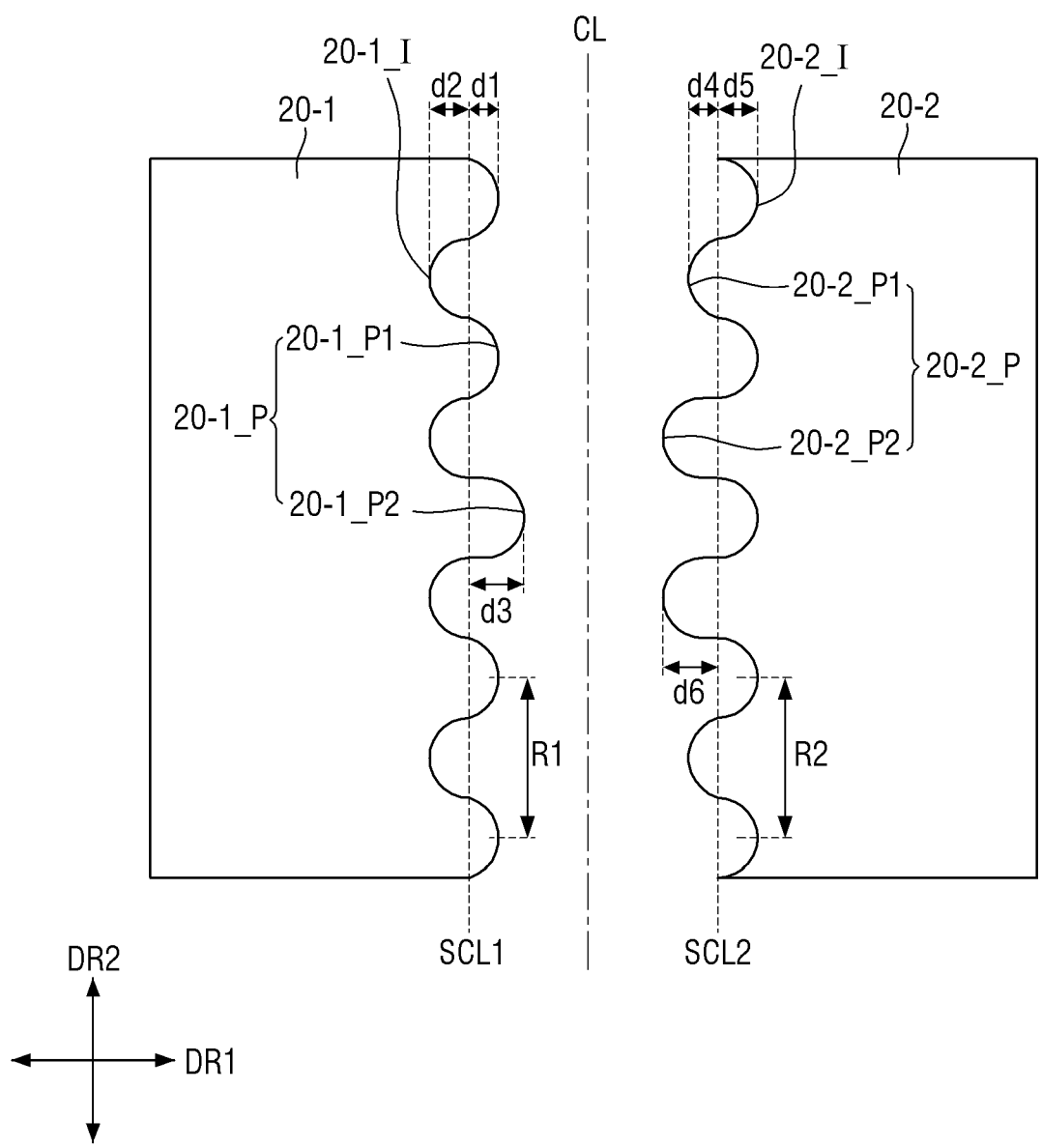
FIG. 10 is a plan view illustrating the spaced first chassis and second chassis according to an embodiment.
Figure 11:
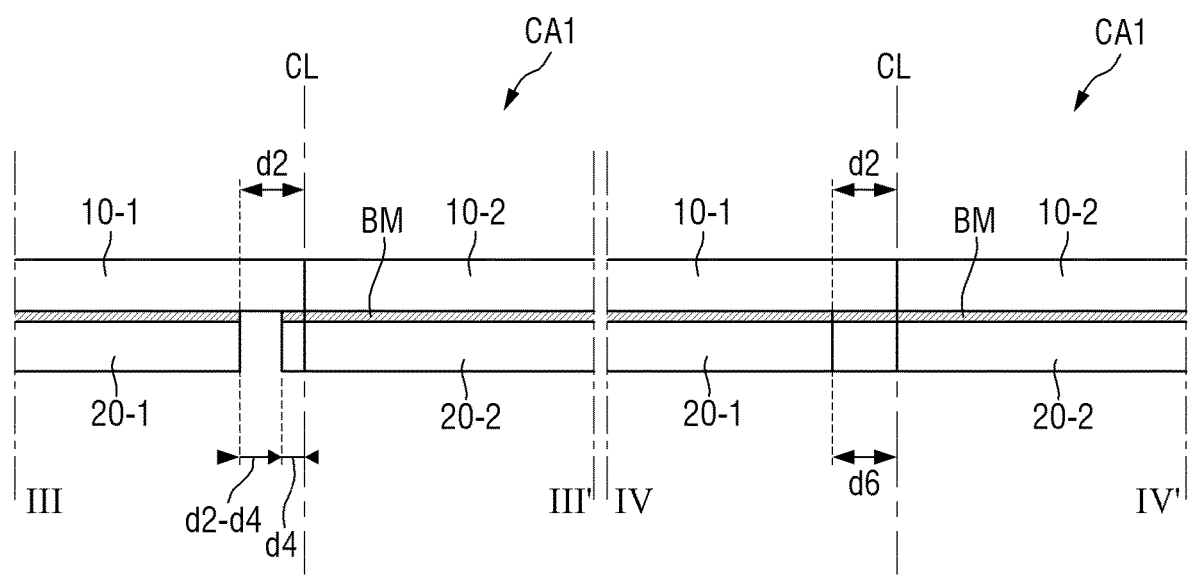
FIG. 11 is a cross-sectional view taken along lines and IV-IV' in FIG. 7.

FIG. 7 is an enlarged plan view of region A in FIG. 6. FIG. 8 is a plan view illustrating a first chassis and a second chassis in FIG. 7. FIG. 9 is a plan view illustrating a state in which the first display device and the second display device in FIG. 7 are spaced apart. FIG. 10 is a plan view illustrating the spaced first chassis and second chassis according to an embodiment. FIG. 11 is a cross-sectional view taken along lines and IV-IV' in FIG. 7;

First, the first coupling portion CA1 among the boundary portion between the display devices 10-1 and 10-2 will be described.

Referring to FIGS. 7 to 11, a reference line CL extending along a portion where an end portion 10-1S of the first display device 10-1 and an end portion 10-2S of the second display device 10-2 come into direct contact with each other may be defined.

The end portions of the first chassis 20-1 may include a first chassis convex portion 20-1_P protruding from the reference line CL to one side in the first direction DR1 and a first chassis concave portion 20-1_I recessed from the reference line CL to the other side in the first direction DR1, which are alternately arranged.

The first chassis convex portion 20-1_P and the first chassis concave portion 20-1_I may be alternately arranged along the second direction DR2.

The end portions of the second chassis 20-2 may include a second chassis convex portion 20-2_P protruding from the reference line CL to one side in the first direction DR1 and a second chassis concave portion 20-2_I recessed from the reference line CL to the other side in the first direction DR1, which are alternately arranged.

The second chassis convex portion 20-2_P and the second chassis concave portion 20-2_I may be alternately arranged along the second direction DR2.

Further, a pitch R1 of the alternately arranged first chassis convex portions 20-1_P and the first chassis concave portions 20-1_I may be uniform, and a pitch R2 of the alternately arranged second chassis convex portions 20-2_P and the second chassis concave portions 20-2_I may be uniform.

As shown in FIG. 7, the first chassis concave portion 20-1_I and the first chassis convex portion 20-1_P at the end portions of the first chassis 20-1 may each have a circular shape, and the second chassis concave portion 20-2_I and the second chassis convex portion 20-2_P at the end portions of the second chassis 20-2 may each have a circular shape. Both the shapes of the first chassis concave portion 20-1_I and the first chassis convex portion 20-1_P at the end portions of the first chassis 20-1 may be the same, and similarly, both the shapes of the second chassis concave portion 20-2_I and the second chassis convex portion 20-2_P at the end portions of the second chassis 20-2 may be the same. In some embodiments, the first chassis concave portion 20-1_I and the first chassis convex portion 20-1_P at the end portion of the first chassis 20-1 may each have an oval shape, and the second chassis concave portion 20-2_I and the second chassis convex portion 20-2_P at the end portions of the second chassis 20-2 may each have an oval shape.

The first chassis convex portion 20-1_P of the first chassis 20-1 and the second chassis concave portion 20-2_I of the second chassis 20-2 may correspond to each other in the first direction DR1, and the second chassis convex portion 20-2_P of the second chassis 20-2 and the first chassis concave portion 20-1_I of the first chassis 20-1 may correspond to each other in the first direction DR1.

As shown in FIGS. 7 to 11, the first chassis convex portion 20-1_P may include a first-1 chassis convex portion 20-1_P1 protruding from the reference line CL by a first width d1, and a first-2 chassis convex portion 20-1_P2 protruding from the reference line CL by a third width d3. The first-2 chassis convex portion 20-1_P2 may be located between the first-1 chassis convex portions 20-1_P1. The third width d3 may be greater than the first width d1.

In FIGS. 7 to 11, although the number of first-2 chassis convex portion 20-1_P2 is illustrated as one, the number is not limited thereto, and may be two or more.

Further, the first chassis concave portion 20-1_I may be recessed from the reference line CL by a second width d2, and the second width d2 may have the same size as the third width d3.

In the above, the description was made focusing on the end portions of the first chassis 20-1. The end portions of the second chassis 20-2 may have a shape complementary to that of the end portions of the first chassis 20-1 with respect to the reference line CL. Hereinafter, the end portions of the second chassis 20-2 will be described.

The second chassis convex portion 20-2_P may include a second-1 chassis convex portion 20-2_P1 protruding from the reference line by a fourth width d4, and a second-2 chassis convex portion 20-2_P2 protruding from the reference line CL by a sixth width d6. The sixth width d6 may be greater than the fourth width d4 and may be the same as the third width d3.

The second chassis concave portion 20-2_I may be recessed from the reference line CL by a fifth width d5, and the fifth width d5 may have the same size as the sixth width d6.

The first-1 chassis convex portion 20-1_P1 may be spaced apart from the second chassis concave portion 20-2_I by a predetermined distance, and the second-1 chassis convex portion 20-2_P1 may be spaced apart from the first chassis concave portion 20-1_I by a predetermined distance.

On the other hand, the first-2 chassis convex portion 20-1_P2 may be directly connected to the second chassis concave portion 20-2_I, and the second-2 chassis convex portion 20-2_P2 may be directly connected to the first chassis concave portion 20-1_I.

Since the first chassis 20-1 and the second chassis 20-2 are coupled (or fastened) to each other through the first-2 chassis convex portion 20-1_P2 and the second chassis concave portion 20-2_I corresponding to each other, and the second-2 chassis convex portion 20-2_P2 and the first chassis concave portion 20-1_I corresponding to each other, the first-1 chassis convex portion 20-1_P1 is spaced apart from the second chassis concave portion 20-2_I by a predetermined distance, and the second-1 chassis convex portion 20-2_P1 is spaced apart from the first chassis concave portion 20-1_I by a predetermined distance, detachment (or separation) between the chassis may be further facilitated. Further, when the first chassis 20-1 and the second chassis 20-2 are formed of only chassis convex portions 20-1_P2 and 20-2_P2 respectively having the third width d3 and the sixth width d6, since there is a possibility that incomplete assembly may occur in the case in which the pitches R1 and R2 of the chassis 20-1 and 20-2 are different, it is possible to achieve stable coupling (or fastening) between the first chassis 20-1 and the second chassis 20-2, and secure ease of detachment (or separation) and assembly between the chassis through the method described above.

The first display device 10-1 may overlap the first chassis concave portion 20-1_I and the second chassis convex portion 20-2_P in the thickness direction, and the second display device 10-2 may overlap the second chassis concave portion 20-2_I and the first chassis convex portion 20-1_P in the thickness direction. Further, the first display device 10-1 may not overlap the first chassis convex portion 20-1_P in the thickness direction, and the second display device 10-2 may not overlap the second chassis convex portion 20-2_P in the thickness direction.

Accordingly, as described above, since the area (or the width) of the boundary portion between the display devices 10-1 and 10-2 is reduced by a width in which the concave portions 20-1_I and 20-2_I of each chassis 20-1 and 20-2 are recessed, the overall visibility of the boundary portion of the tiled display device 1 may decrease.

Further, since the convex portions 20-1_P and 20-2_P of the chassis 20-1 and 20-2 are formed to protrude outward from the end portions 10-1S and 10-2S of the corresponding display devices 10-1 and 10-2, there is an advantage in that prevention of external impacts to the display device 10-1 and 10-2 may be achieved.

As shown in FIG. 11, a black matrix BM may be further disposed on each of one surface of the first chassis 20-1 facing the first display device 10-1 and one surface of the second chassis 20-2 facing the second display device 10-2.

Hereinafter, the second and third connection portions CA2 and CA3 at the boundary portion between the first display device 10-1 and the second display device 10-2 will be described. While describing the second connection portion CA2 and the third connection portion CA3, a detailed description of the contents described in the first connection portion CA1 will be omitted.

Figure 12:
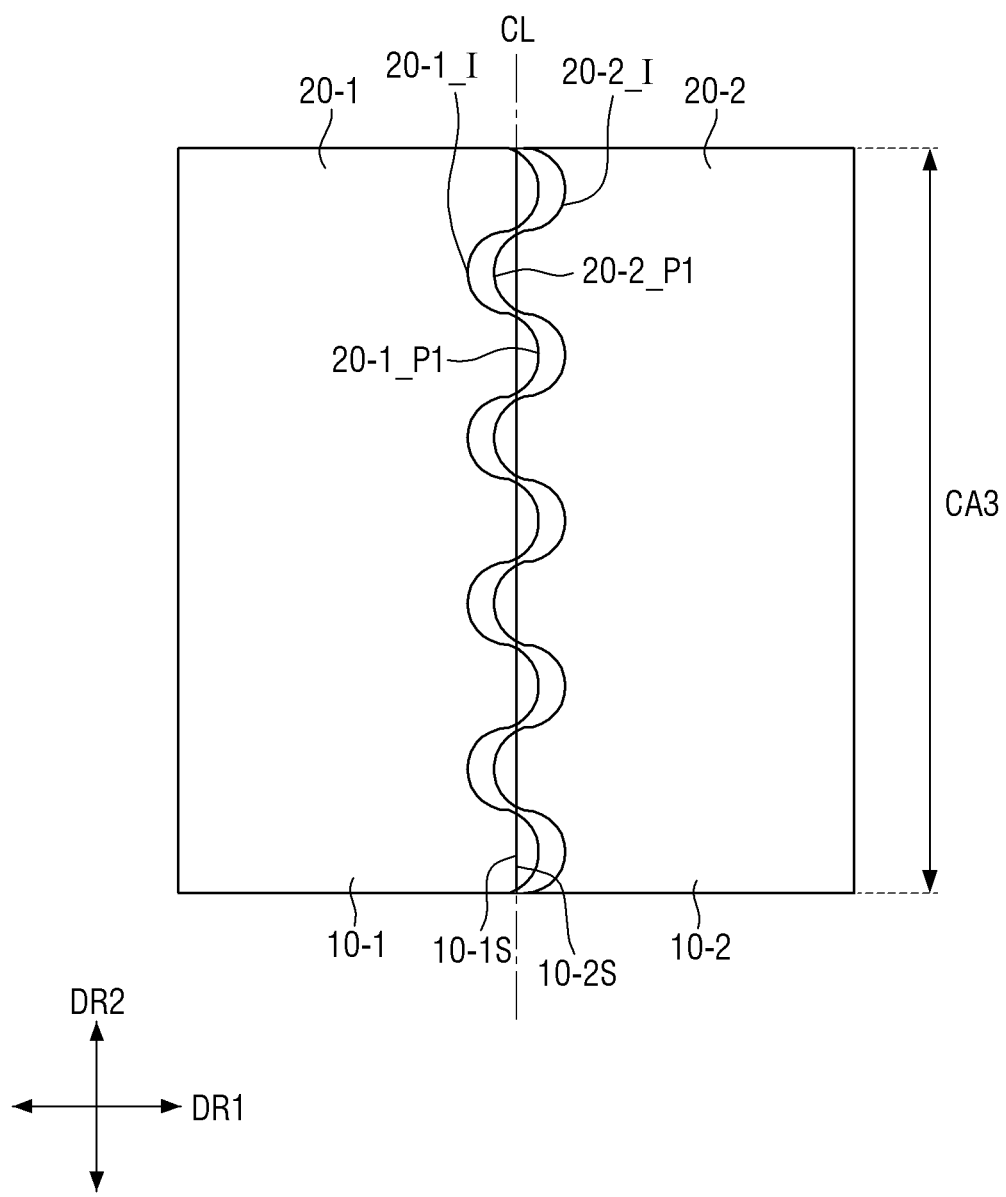
FIG. 12 is an enlarged plan view of region B in FIG. 6.
Figure 13:
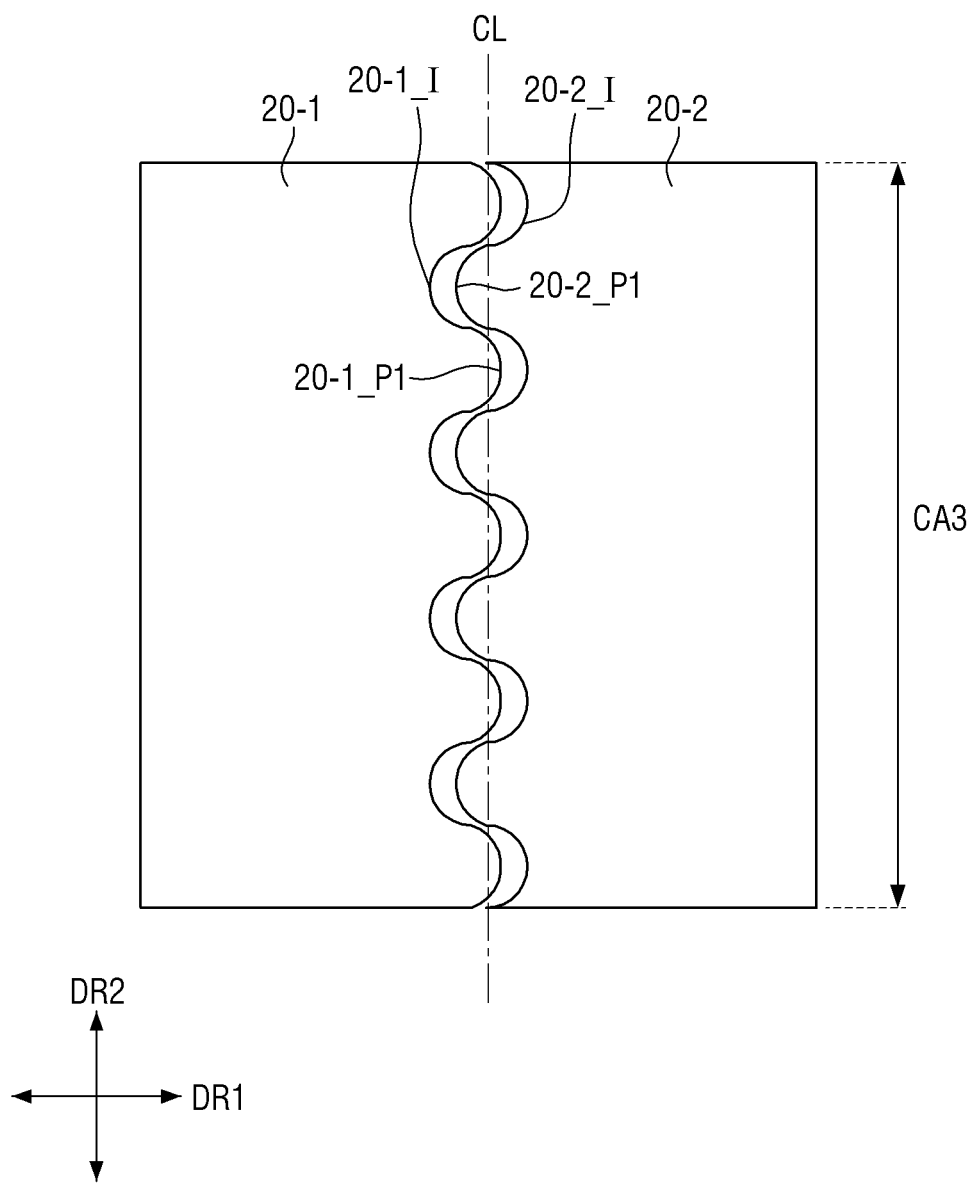
FIG. 13 is a plan view illustrating a first chassis and a second chassis in FIG. 12.
Figure 14:
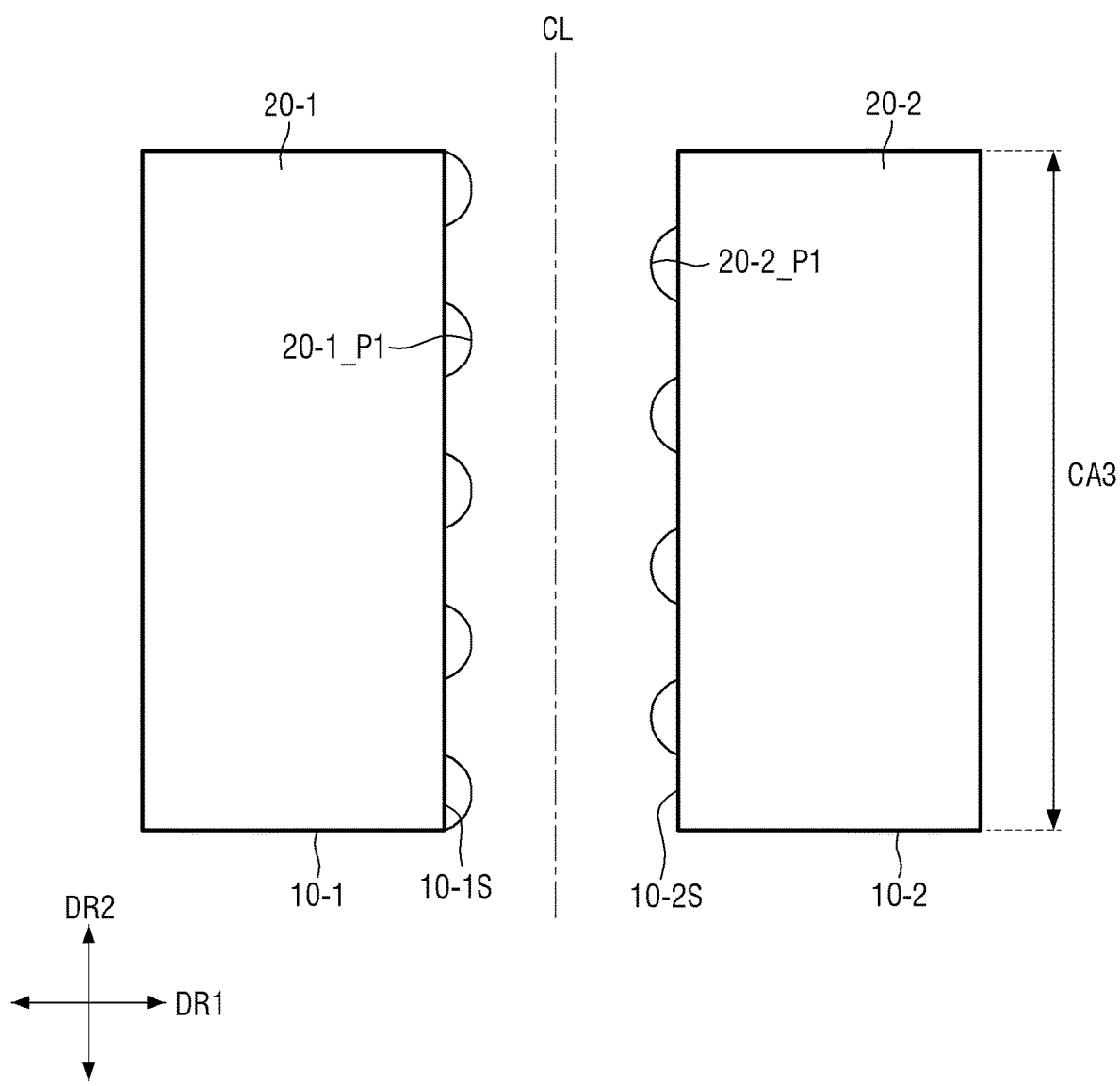
FIG. 14 is a plan view illustrating a state in which the first display device and the second display device in FIG. 12 are spaced apart.

FIG. 12 is an enlarged plan view of region B in FIG. 6. FIG. 13 is a plan view illustrating a first chassis and a second chassis in FIG. 12. FIG. 14 is a plan view illustrating a state in which the first display device and the second display device in FIG. 12 are spaced apart.

The third connection portion CA3 illustrated in FIGS. 12 to 14 differs from the first connection portion CA1 described in FIGS. 7 to 11 in that the end portion of the first chassis 20-1 does not include the first-2 chassis convex portion 20-1_P2, and the end portion of the second chassis 20-2 does not include the second-2 chassis convex portion 20-2_P2 in the second connection portion CA2.

Figure 15:
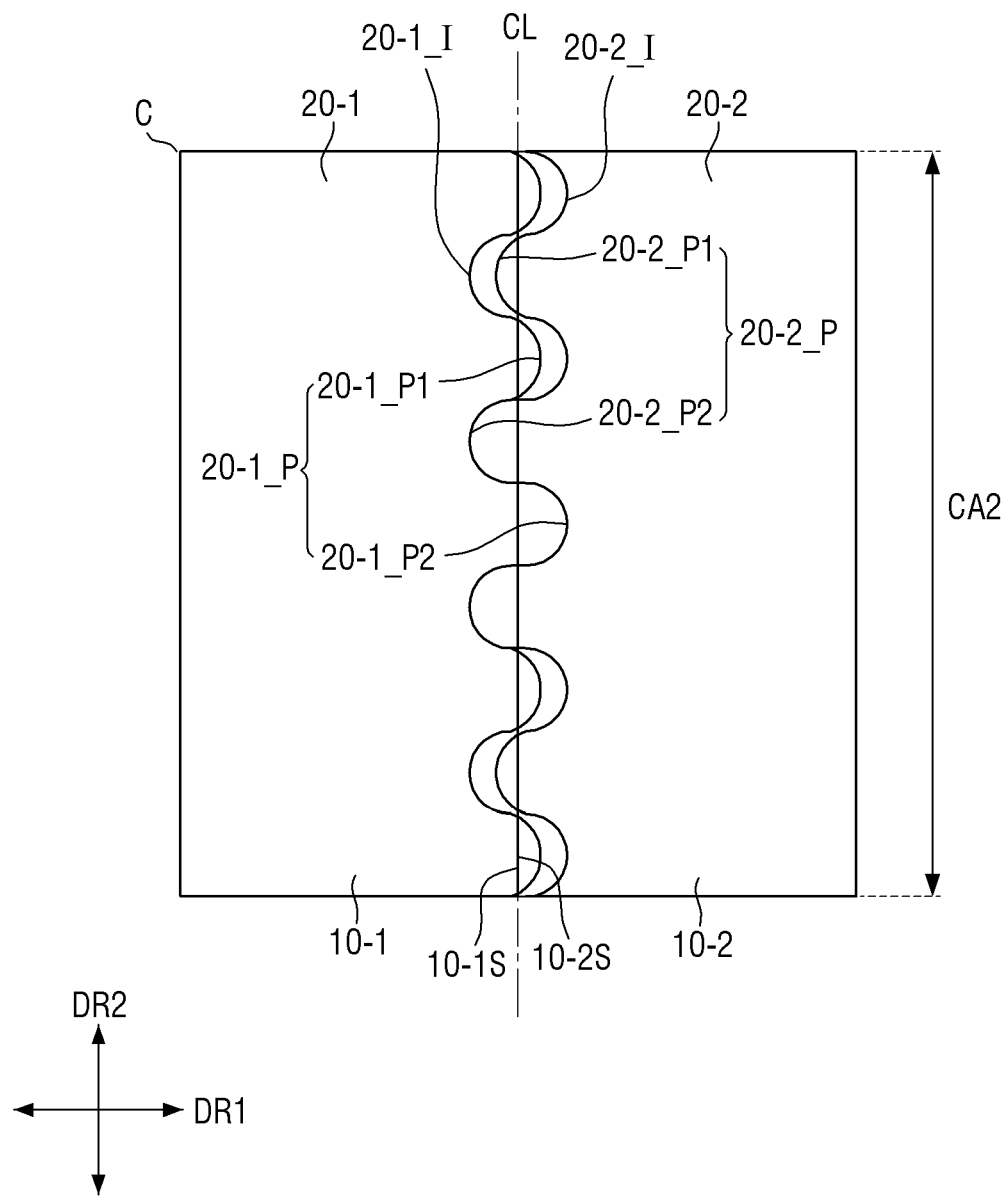
FIG. 15 is an enlarged plan view of region C in FIG. 6.
Figure 16:
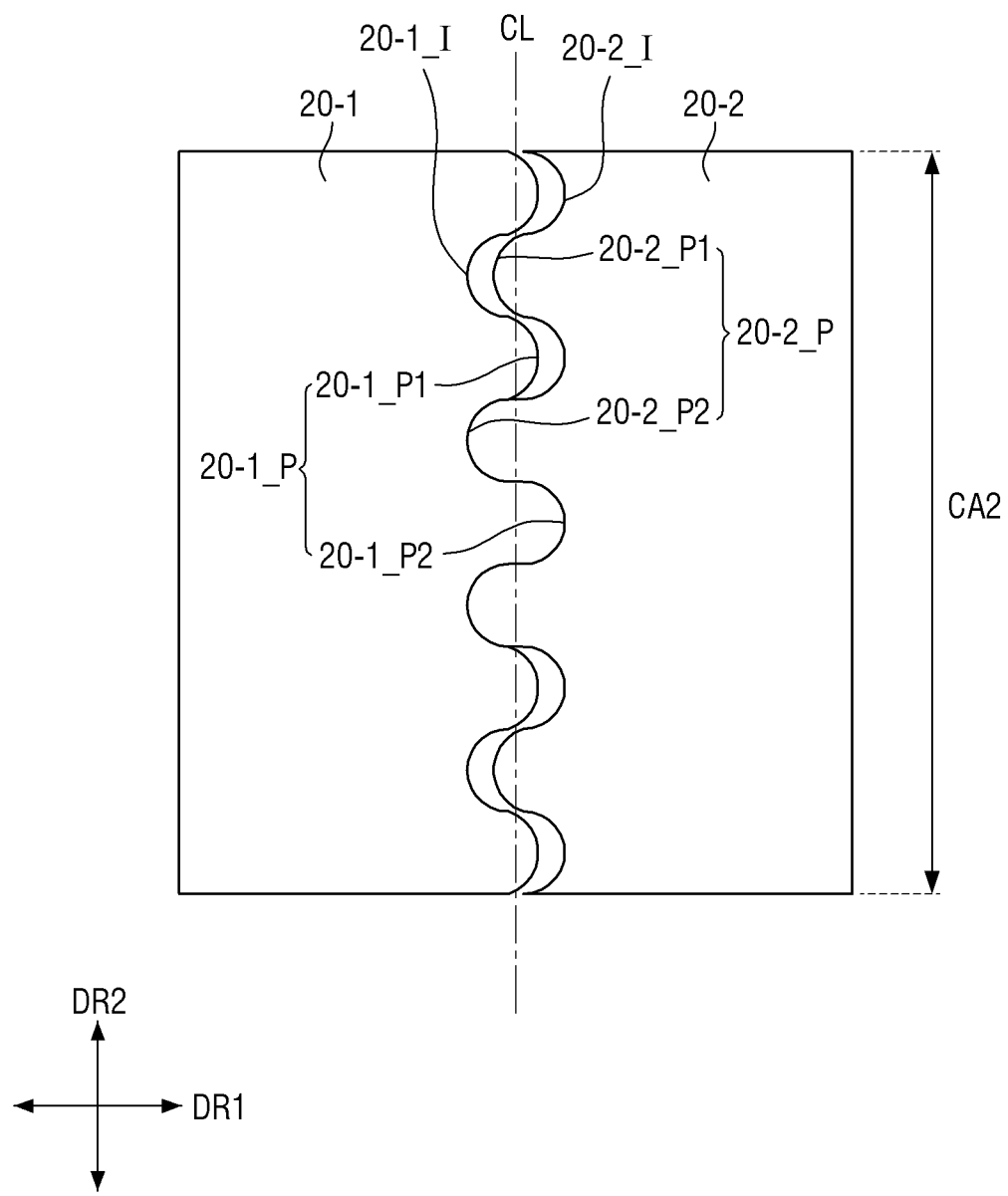
FIG. 16 is a plan view illustrating a first chassis and a second chassis in FIG. 15.
Figure 17:
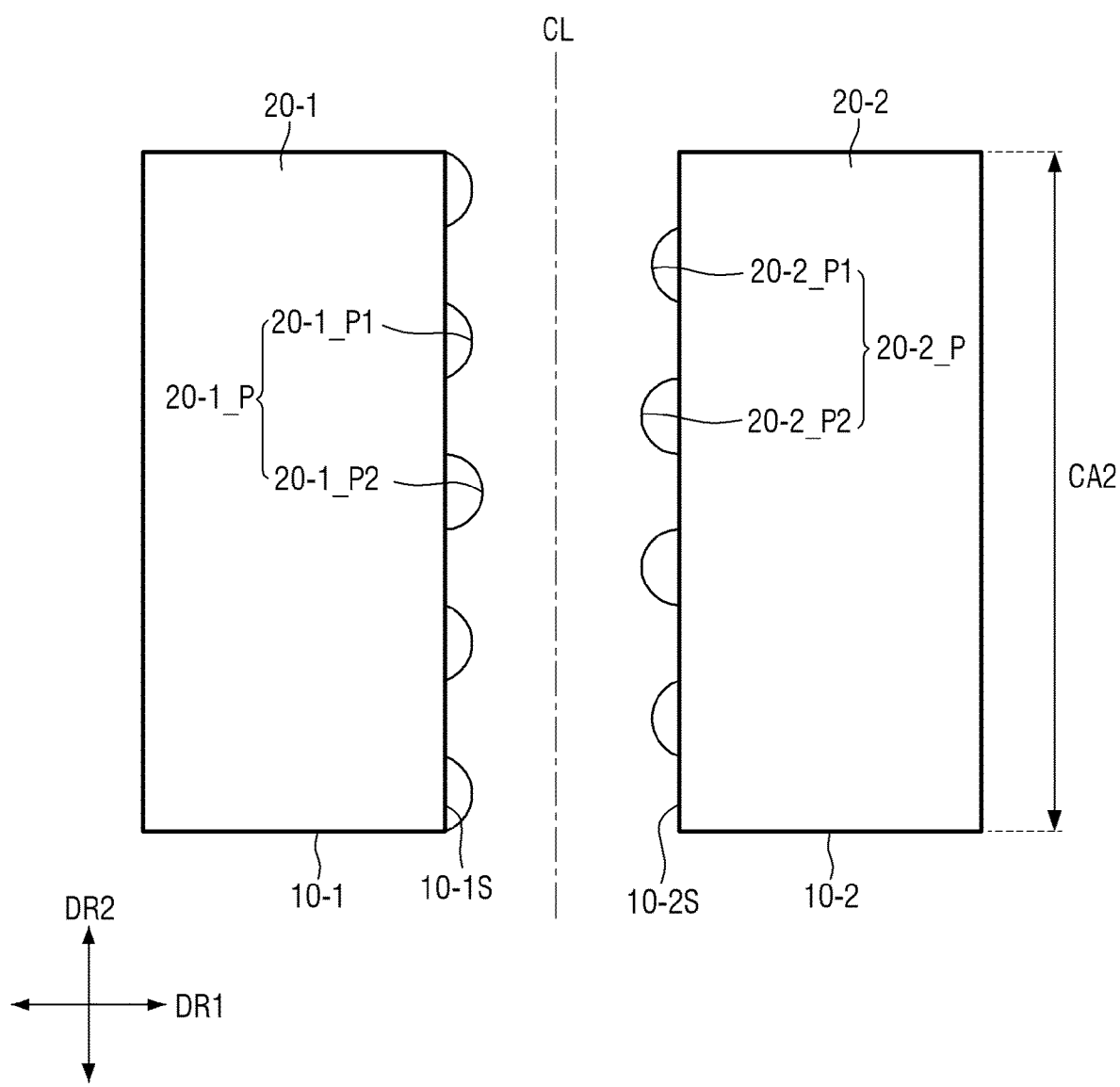
FIG. 17 is a plan view illustrating a state in which the first display device and the second display device in FIG. 15 are spaced apart.

FIG. 15 is an enlarged plan view of region C in FIG. 6. FIG. 16 is a plan view illustrating the first chassis and the second chassis in FIG. 15. FIG. 17 is a plan view illustrating a state in which the first display device and the second display device in FIG. 15 are spaced apart.

Referring to FIGS. 15 to 17, since the third connection portion CA3 is substantially the same as the first connection portion CA1 except that the third connection portion CA3 is located at the other side of the boundary portion in the second direction DR2, overlapping descriptions will be omitted.

Referring again to FIGS. 7 to 17, an overlapping area of the first display device 10-1 and the second chassis 20-2 in the first and third connection portions CA1 and CA3 may be larger than an overlapping area of the first display device 10-1 and the second chassis 20-2 in the second connection portion CA2.

Further, an overlapping area of the second display device 10-2 and the first chassis 20-1 in the first and third connection portions CA1 and CA3 may be larger than an overlapping area of the second display device 10-2 and the second chassis 20-2 in the second connection portion CA2.

Figure 18:
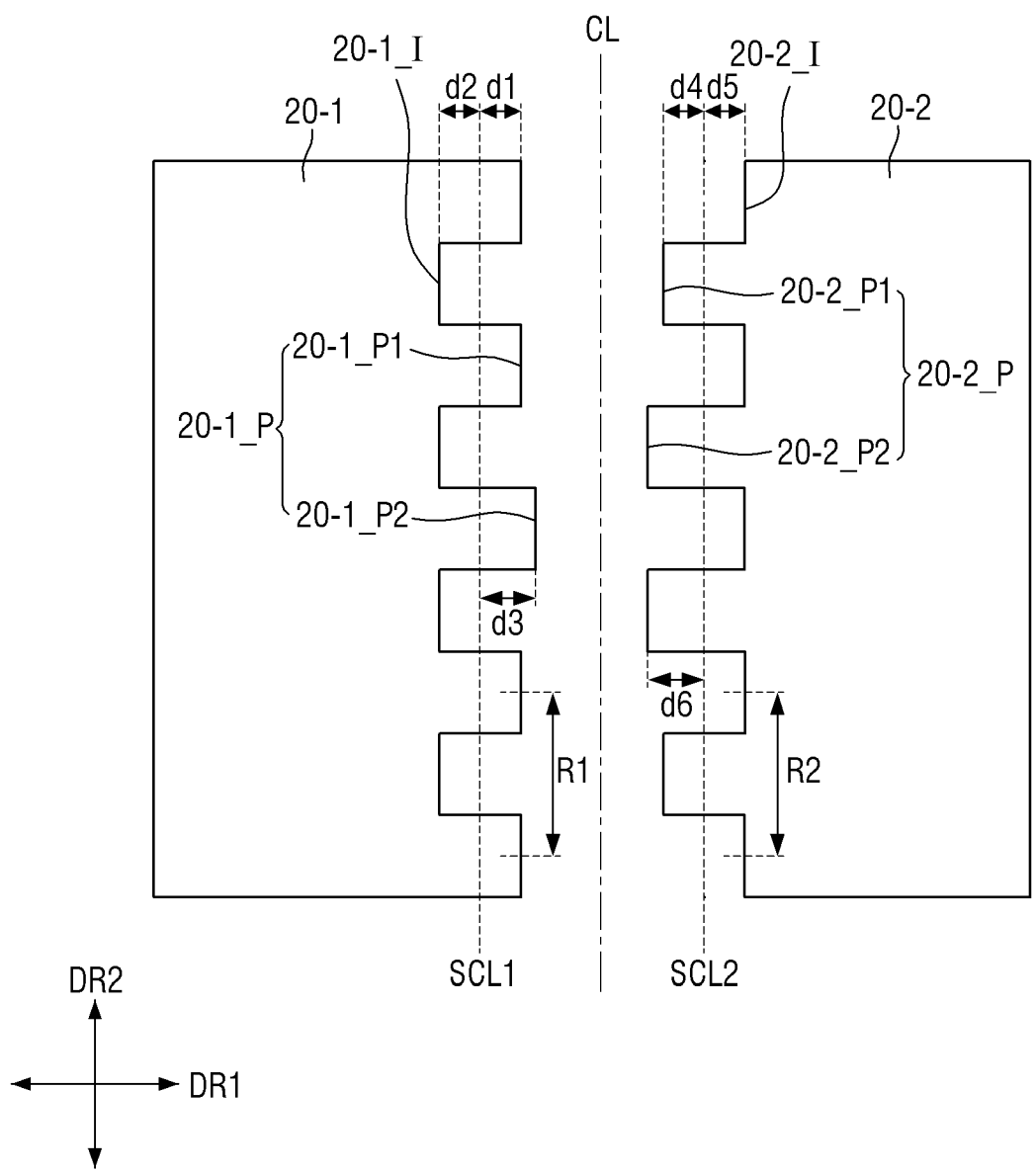
FIGS. 18 and 19 are plan views illustrating the spaced first chassis and second chassis according to modified examples.
Figure 19:
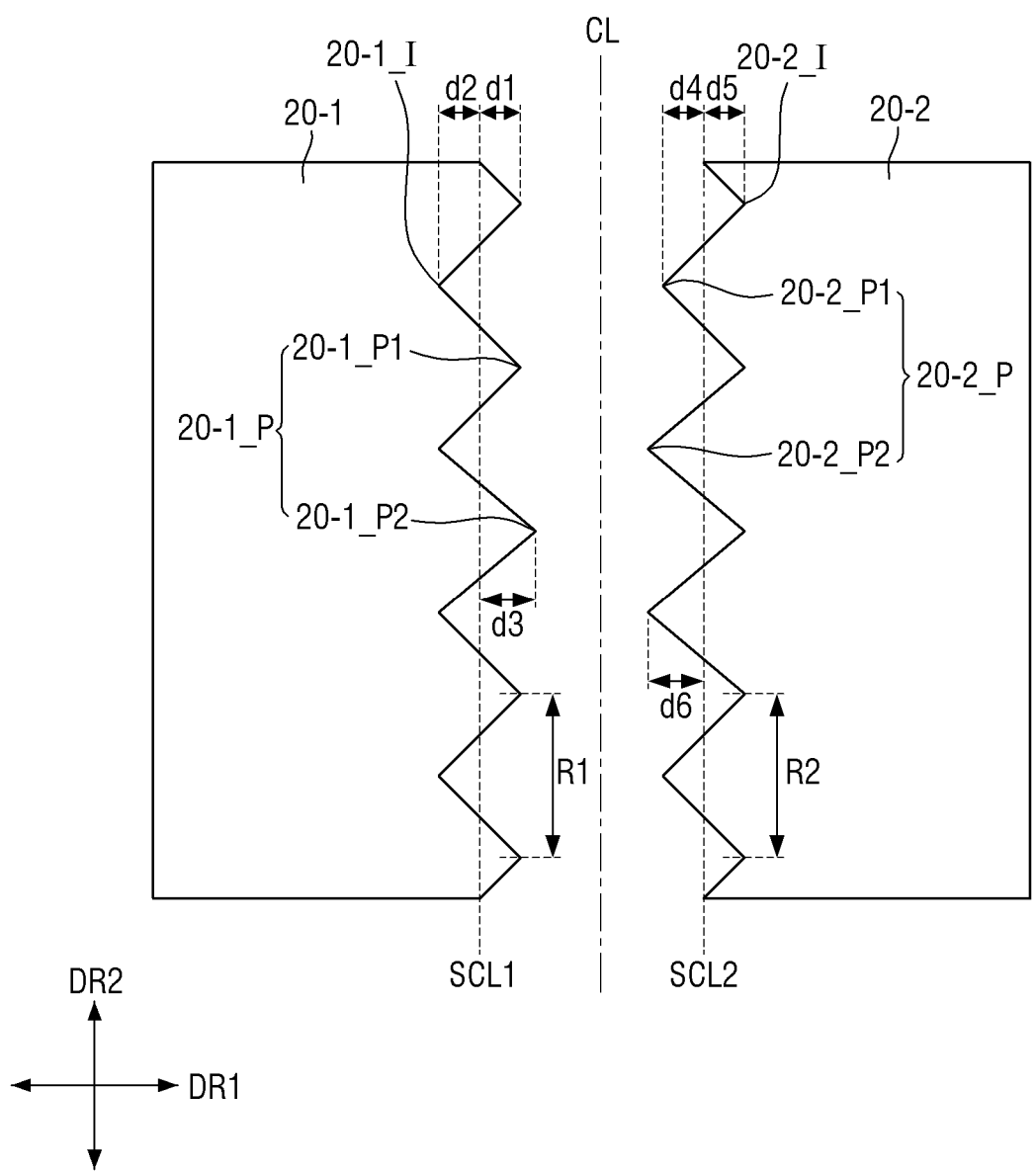

FIGS. 18 and 19 are plan views illustrating the spaced first chassis and second chassis according to modified examples.

FIGS. 18 and 19 illustrate that shapes of the convex portions and the concave portions of the end portion of the first chassis 20-1 and the end portion of the second chassis 20-2 may be modified.

As shown in FIG. 18, the first chassis concave portion 20-1_I and the first chassis convex portion 20-1_P at the end portion of the first chassis 20-1 may each have a quadrangular shape, and the second chassis concave portion 20-2_I and the second chassis convex portion 20-2_P at the end portion of the second chassis 20-2 may each have a quadrangular shape.

As shown in FIG. 19, the first chassis concave portion 20-1_I and the first chassis convex portion 20-1_P at the end portion of the first chassis 20-1 may each have a triangular shape, and the second chassis concave portion 20-2_I and the second chassis convex portion 20-2_P at the end portion of the second chassis 20-2 may each have a triangular shape.

Hereinafter, other embodiments will be described. In the following embodiments, the same components as those of the above-described embodiment will be referred to with the same reference numerals, and descriptions thereof will be omitted or simplified.

Figure 20:
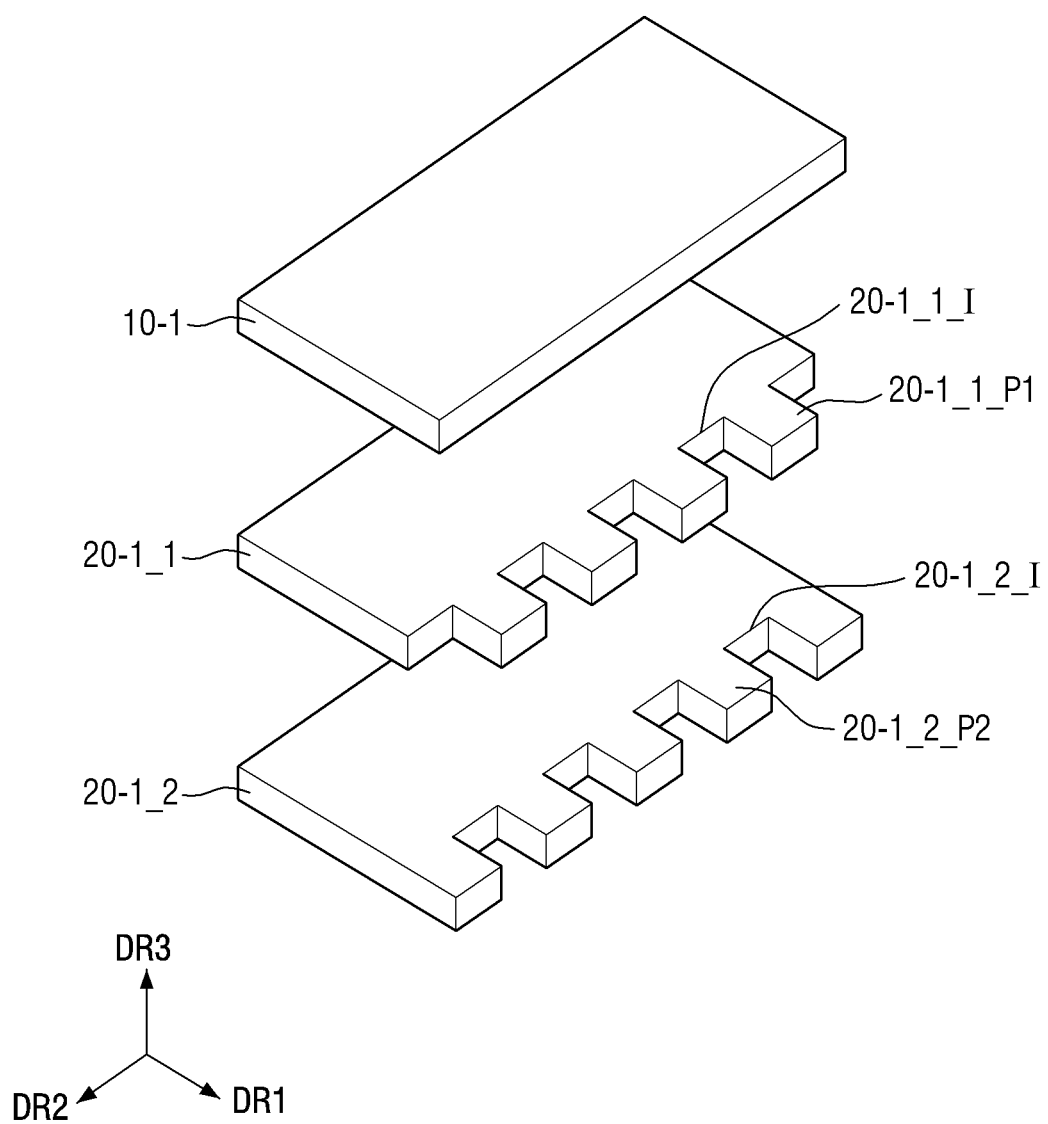
FIG. 20 is an exploded perspective view illustrating a first display device according to another embodiment.
Figure 21:
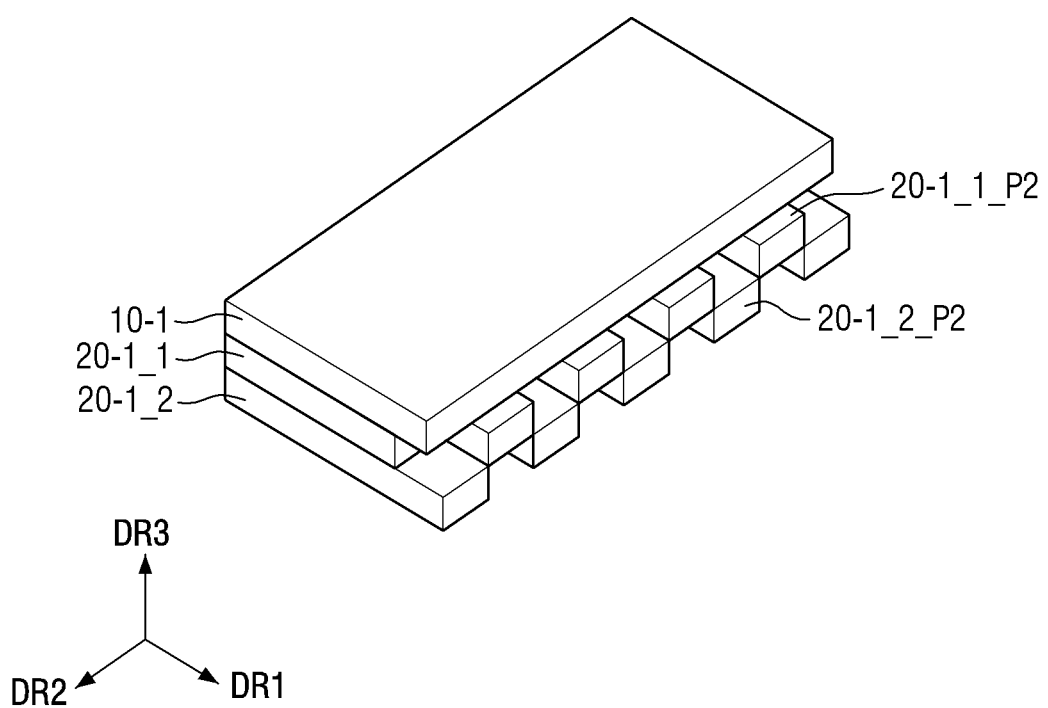
FIG. 21 is a perspective view illustrating the first display device in FIG. 20.

FIG. 20 is an exploded perspective view illustrating a first display device according to another embodiment. FIG. 21 is a perspective view illustrating the first display device in FIG. 20.

Referring to FIGS. 20 and 21, a tiled display device may further include a third chassis 20-1_2 disposed under a first chassis 20-1_1 or 20-1 in FIGS. 7 to 17.

End portions of the third chassis 20-1_2 may include a third chassis convex portion 20-1_2_P2 protruding from a reference line CL to one side in a first direction DR1 and a third chassis concave portion 20-1_2_I recessed from the reference line CL to the other side in the first direction DR1, which are alternately arranged.

Further, the third chassis convex portion 20-1_2_P2 and the third chassis concave portion 20-1_2_I at the end portion of the third chassis 20-1_2 may be alternately arranged with the first chassis convex portion 20-1_1_P1 and the first chassis concave portion 20-1_1_I at the end portion of the first chassis 20-1_1 along a second direction DR2.

In some embodiments, the first chassis 20-1_1 and the third chassis 20-1_2 may not be separated as shown in FIGS. 20 and 21, but may be integrally formed.

In FIGS. 20 and 21, only the first chassis 20-1_1 and the third chassis 20-1_2 are described, but the tiled display device may further include the second chassis and a fourth chassis overlapping the second chassis (20-1 in FIGS. 7 to 17). Shapes of a convex portion and a concave portion of the fourth chassis may be formed to correspond to (or be complementary from) the shapes of the concave portion and the convex portion of the third chassis, respectively.

In a tiled display device according to embodiments, it is possible to provide a tiled display device in which a boundary portion between a plurality of display devices is hardly recognized and stability against external impacts can be secured.

Although certain embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A tiled display device comprising:
a first display device;
a second display device located at one side of the first display device in a first direction;
a first chassis disposed under the first display device to support the first display device; and
a second chassis disposed under the second display device to support the second display device,
wherein:
an end portion of the first chassis and an end portion of the second chassis are directly connected to each other;
an end portion of the first display device and an end portion of the second display device come into direct contact with each other;
a reference line extending along a portion where the end portion of the first display device and the end portion of the second display device come into direct contact with each other is defined;
the end portion of the first chassis includes first chassis convex portions protruding from the reference line to one side in the first direction, and first chassis concave portions recessed from the reference line to the other side in the first direction, which are alternately arranged;
the end portion of the second chassis includes second chassis convex portions protruding from the reference line to the other side in the first direction, and second chassis concave portions recessed from the reference line to one side in the first direction, which are alternately arranged; and
the first display device overlaps the first chassis concave portion and the second chassis convex portion in a thickness direction which crosses the first direction and the second direction.

2. The tiled display device of claim 1, wherein:
pitches of the first chassis convex portions and pitches of the first chassis concave portions, which are alternately arranged, are uniform; and
pitches of the second chassis convex portions and pitches of the second chassis concave portions, which are alternately arranged, are uniform.

3. The tiled display device of claim 2, wherein:
the first chassis convex portions and the second chassis concave portions correspond to each other; and
the second chassis convex portions and the first chassis concave portions correspond to each other.

4. The tiled display device of claim 1, wherein;
the second display device overlaps the second chassis concave portion and the first chassis convex portion in the thickness direction.

5. The tiled display device of claim 4, wherein:
the first display device does not overlap the first chassis convex portion in the thickness direction; and
the second display device does not overlap the second chassis convex portion in the thickness direction.

6. The tiled display device of claim 1, further comprising black matrixes disposed at one surface facing the first display device of the first chassis and one surface facing the second display device of the second chassis.

7. The tiled display device of claim 1, further comprising a third chassis disposed under the first chassis, and a fourth chassis disposed under the second chassis,
wherein an end portion of the third chassis includes third chassis convex portions protruding from the reference line to one side in the first direction, and third chassis concave portions recessed from the reference line to the other side in the first direction, which are alternately arranged, and
an end portion of the fourth chassis includes fourth chassis convex portions protruding from the reference line to the other side in the first direction, and fourth chassis concave portions recessed from the reference line to one side in the first direction, which are alternately arranged.

8. The tiled display device of claim 7, wherein:
the third chassis convex portions and the first chassis convex portion are alternately arranged along the second direction in a plan view; and
the fourth chassis convex portions and the second chassis convex portions are alternately arranged along the second direction in a plan view.

9. The tiled display device of claim 1, wherein:
each of the display devices includes a display region including a plurality of pixels, and a non-display region located around the display region; and
each of the plurality of pixels includes an inorganic light emitting element.

10. A tiled display device comprising:
a first display device;
a second display device located at one side of the first display device in a first direction;
a first chassis disposed under the first display device to support the first display device; and
a second chassis disposed under the second display device to support the second display device,
wherein:
an end portion of the first chassis and an end portion of the second chassis are directly connected to each other;
an end portion of the first display device and an end portion of the second display device come into direct contact with each other;
a reference line extending along a portion where the end portion of the first display device and the end portion of the second display device come into direct contact with each other is defined;
the end portion of the first chassis includes first chassis convex portions protruding from the reference line to one side in the first direction, and first chassis concave portions recessed from the reference line to the other side in the first direction, which are alternately arranged;
the end portion of the second chassis includes second chassis convex portions protruding from the reference line to the other side in the first direction, and second chassis concave portions recessed from the reference line to one side in the first direction, which are alternately arranged;
pitches of the first chassis convex portions and pitches of the first chassis concave portions, which are alternately arranged, are uniform;
pitches of the second chassis convex portions and pitches of the second chassis concave portions, which are alternately arranged, are uniform;
the first chassis convex portions and the second chassis concave portions correspond to each other;
the second chassis convex portions and the first chassis concave portions correspond to each other;
the first chassis convex portion includes a first-1 chassis convex portion protruding from the reference line by a first width, and a first-2 chassis convex portion protruding from the reference line by a third width; and
the third width is greater than the first width.

11. The tiled display device of claim 10, wherein:
the first chassis concave portion is recessed from the reference line by a second width; and
the second width is equal to the third width.

12. The tiled display device of claim 11, wherein:
the second chassis convex portion includes a second-1 chassis convex portion protruding from the reference line by a fourth width, and a second-2 chassis convex portion protruding from the reference line by a sixth width; and
the sixth width is greater than the fourth width, and the sixth width is equal to the third width.

13. The tiled display device of claim 12, wherein:
the second chassis concave portion is recessed from the reference line by a fifth width; and
the fifth width is equal to the sixth width.

14. The tiled display device of claim 13, wherein:
the first-1 chassis convex portion is spaced apart from the second chassis concave portion by a predetermined distance; and
the second-1 chassis convex portion is spaced apart from the first chassis concave portion by a predetermined distance.

15. The tiled display device of claim 14, wherein:
the first-2 chassis convex portion is directly connected to the second chassis concave portion; and
the second-2 chassis convex portion is directly connected to the first chassis concave portion.

16. The tiled display device of claim 15, wherein:
connection portions between the first chassis and the second chassis include a first connection portion located at one side in a second direction crossing the first direction, a second connection portion located at the other side in the second direction, and a third connection portion located between the first connection portion and the second connection portion; and
in the second connection portion, the end portion of the first chassis does not include the first-2 chassis convex portion, and the end portion of the second chassis does not include the second-2 chassis convex portion.

17. The tiled display device of claim 16, wherein, in the first and third connection portions, the first-2 chassis convex portion and the second chassis concave portion are directly connected to each other, and the second-2 chassis convex portion and the first chassis concave portion are directly connected to each other.

18. A tiled display device comprising:
a first display device;
a second display device located at one side of the first display device in a first direction;
a first chassis disposed under the first display device to support the first display device; and
a second chassis disposed under the second display device to support the second display device,
wherein:
an end portion of the first chassis and an end portion of the second chassis are directly connected;
an end portion of the first display device and an end portion of the second display device come into direct contact with each other;
wherein:
the first chassis includes:
 a first convex portion located at one side in a second direction crossing the first direction and protruding in the first direction from a reference line extending in the second direction by a first width;
 a second convex portion located at one side in a second direction and protruding in the first direction from the reference line by a second width; and
 a third convex portion located between the first connection portion and the second connection portion and protruding in the first direction from the reference line by a third width, and
the third width is greater than each of the first width and the second width.

19. The tiled display device of claim 18, wherein: the second chassis includes:
a first concave portion accommodating the first convex portion and recessed in the first direction by a fourth width;
a second concave portion accommodating the second convex portion and recessed in the first direction by a fifth width; and
a third concave portion accommodating the third convex portion and recessed in the first direction by a sixth width;
the sixth width is greater than each of the fourth width and the fifth width.

* * * * *